(12) United States Patent
Lu

(10) Patent No.: US 12,284,799 B2
(45) Date of Patent: Apr. 22, 2025

(54) MEMORY, SEMICONDUCTOR STRUCTURE AND METHOD FOR FORMING SAME

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 353 days.

(21) Appl. No.: 17/885,727

(22) Filed: Aug. 11, 2022

(65) Prior Publication Data

US 2023/0389286 A1 Nov. 30, 2023

Related U.S. Application Data

(63) Continuation of application No. PCT/CN2022/097961, filed on Jun. 9, 2022.

(30) Foreign Application Priority Data

May 31, 2022 (CN) .......................... 202210610158.5

(51) Int. Cl.
H10B 12/00 (2023.01)

(52) U.S. Cl.
CPC .......... *H10B 12/315* (2023.02); *H10B 12/03* (2023.02); *H10B 12/033* (2023.02); *H10B 12/0335* (2023.02)

(58) Field of Classification Search
CPC .. H10B 12/03; H10B 12/033; H10B 12/0335; H10B 12/315
See application file for complete search history.

(56) References Cited

U.S. PATENT DOCUMENTS

| 10,629,675 | B1 | 4/2020 | Nishikawa | |
| 2008/0217672 | A1* | 9/2008 | Popp | .................. H01L 28/91 |
| | | | | 257/305 |

(Continued)

FOREIGN PATENT DOCUMENTS

| CN | 102237364 A | 11/2011 |
| CN | 106816434 A | 6/2017 |
| CN | 107634047 A | 1/2018 |

(Continued)

OTHER PUBLICATIONS

International Search Report and Written Opinion for PCT/CN2022/097961, mailed on Dec. 27, 2022.

*Primary Examiner* — Zandra V Smith
*Assistant Examiner* — Molly K Reida
(74) *Attorney, Agent, or Firm* — Syncoda LLC; Feng Ma

(57) ABSTRACT

The disclosure relates to the technical field of semiconductors, and to a memory, a semiconductor structure and a method for same. The method includes: providing a substrate, the substrate including a plurality of conductive contact plugs in array distribution and insulation layers separating the conductive contact plugs; and forming a plurality of capacitive layers stacked and distributed in a direction perpendicular to the substrate on a surface of the substrate, each of the capacitive layers including a plurality of capacitances distributed at intervals, and the capacitances being respectively connected to different conductive contact plugs. According to the method, the storage capacity of capacitances can be increased, and product yield can be enhanced.

13 Claims, 28 Drawing Sheets

(56) References Cited

U.S. PATENT DOCUMENTS

2011/0260231 A1 10/2011 Liang
2022/0085021 A1 3/2022 Liu et al.

FOREIGN PATENT DOCUMENTS

| CN | 107968044 A | 4/2018 |
| CN | 114188281 A | 3/2022 |
| TW | 200409255 A | 6/2004 |

\* cited by examiner

MEMORY, SEMICONDUCTOR STRUCTURE AND METHOD FOR FORMING SAME

CROSS-REFERENCE TO RELATED APPLICATION

The disclosure is based upon and claims priority to Chinese Patent Application No. 202210610158.5, filed on May 31, 2022 and entitled "MEMORY, SEMICONDUCTOR STRUCTURE AND METHOD FOR FORMING SAME", the disclosure of which is hereby incorporated by reference in its entirety.

TECHNICAL FIELD

The disclosure relates to the technical field of semiconductors, and specifically, to a memory, a semiconductor structure, and a method for forming the same.

BACKGROUND

A Dynamic Random Access Memory (DRAM) is widely applied to mobile devices such as mobile phones and tablet computers due to its advantages of a small size, a high degree of integration, and a fast transmission speed. As a core component of the DRAM, a capacitor is mainly configured to store charge. However, a conventional capacitor is small in storage capacity and is limited by a manufacturing process, so that the conventional capacitor has low device yield.

It is to be noted that, information disclosed in the above Background section is merely for enhancement of understanding of the background of the disclosure, and may include information that does not constitute the prior art that is already known to those of ordinary skill in the art.

SUMMARY

In order to overcome the disadvantages in the prior art, the disclosure is intended to provide a memory, a semiconductor structure and a method for forming the same. Therefore, the storage capacity of capacitances can be increased, and product yield can be enhanced.

An aspect of the disclosure provides a method for forming a semiconductor structure. The method includes the following operations.

A substrate is provided and includes a plurality of conductive contact plugs in array distribution and insulation layers separating the conductive contact plugs.

A plurality of capacitive layers stacked and distributed in a direction perpendicular to the substrate are formed on a surface of the substrate. Each of the capacitive layers includes a plurality of capacitances distributed at intervals. The capacitances are respectively connected to different conductive contact plugs.

In an exemplary embodiment of the disclosure, the formation of the plurality of capacitive layers stacked and distributed in the direction perpendicular to the substrate on the surface of the substrate with each of the capacitive layers including the plurality of capacitances distributed at intervals and the capacitances being respectively connected to different conductive contact plug includes the following operations.

A first capacitive layer is formed on the surface of the substrate. The first capacitive layer includes a plurality of first capacitances, and the first capacitances are respectively connected to different conductive contact plugs.

A second capacitive layer is formed on a side of the first capacitive layer facing away from the substrate. The second capacitive layer includes a plurality of second capacitances. The second capacitances are respectively connected to different conductive contact plugs. The conductive contact plugs connected to the second capacitances and the conductive contact plugs connected to the first capacitances are different conductive contact plugs.

In an exemplary embodiment of the disclosure, the formation of the first capacitive layer on the surface of the substrate with the first capacitive layer including the plurality of first capacitances, and the first capacitances being respectively connected to different conductive contact plugs includes the following operations.

A first stacked film layer is formed on the surface of the substrate.

A plurality of first capacitance holes distributed at intervals are formed in the first stacked film layer, and at least one conductive contact plug is exposed from each first capacitance hole.

The first capacitance is formed in the first capacitance hole.

In an exemplary embodiment of the disclosure, the first stacked film layer includes a first support layer and a first sacrificial layer. The first sacrificial layer is formed on a side of the first support layer facing away from the substrate. The formation of the first capacitance in the first capacitance hole includes the following operations.

A lower electrode layer of the first capacitance is formed on a sidewall and bottom of the first capacitance hole.

The first sacrificial layer is removed.

A dielectric layer of the first capacitance is formed on a surface of the lower electrode layer of the first capacitance.

An upper electrode layer of the first capacitance is formed on a surface of the dielectric layer of the first capacitance.

In an exemplary embodiment of the disclosure, the method further includes the following operations.

A first semiconductor layer covering the first capacitive layer is formed, and is filled up a gap in the first capacitance and a gap between the first capacitances.

In an exemplary embodiment of the disclosure, the operation of forming the second capacitive layer on the side of the first capacitive layer facing away from the substrate, the second capacitive layer including the plurality of second capacitances, the second capacitances being respectively connected to different conductive contact plugs, and the conductive contact plugs connected to the second capacitances and the conductive contact plugs connected to the first capacitances being different conductive contact plugs includes the following operations.

A via penetrating the first semiconductor layer and the first support layer is formed. An orthographic projection of the via on the substrate is not overlapping with an orthographic projection of the first capacitance hole. At least one conductive contact plug is exposed from each via.

An insulation material layer is Minted on a sidewall of the via.

The via is filled with a conductive material to form a conductive column, and the insulation material layer is in contact connection with a sidewall of the conductive column.

Second stacked film layers are formed on sides of the first semiconductor layer and the conductive column facing away from the substrate.

A plurality of second capacitance holes distributed at intervals are formed in the second stacked film layers, and at least one conductive column is exposed from each second capacitance hole.

The second capacitance is formed in the second capacitance hole.

In an exemplary embodiment of the disclosure, the second stacked film layer includes a second support layer and a second sacrificial layer, and the second sacrificial layer is formed on a side of the second support layer facing away from the substrate. The formation of the second capacitance in the second capacitance hole includes the following operations.

A lower electrode layer of the second capacitance is formed on a sidewall and bottom of the second capacitance hole.

The second sacrificial layer is removed.

A dielectric layer of the second capacitance is formed on a surface of the lower electrode layer of the second capacitance.

An upper electrode layer of the second capacitance is funned on a surface of the dielectric layer of the second capacitance.

In an exemplary embodiment of the disclosure, the method further includes the following operation.

A second semiconductor layer covering the second capacitive layer is formed, and is filled up a gap in the second capacitance and a gap between the second capacitances. The second semiconductor layer is in contact connection with the first semiconductor layer.

According to an aspect of the disclosure, a semiconductor structure is provided. The semiconductor structure includes a substrate and a plurality of capacitive layers.

The substrate includes a plurality of conductive contact plugs in array distribution and insulation layers separating the conductive contact plugs.

Each of the capacitive layers is formed on a surface of the substrate, and stacked and distributed in a direction perpendicular to the substrate. Each of the capacitive layers includes a plurality of capacitances distributed at intervals. The capacitances are respectively connected to different conductive contact plugs.

In an exemplary embodiment of the disclosure, the plurality of capacitive layers further include a first capacitive layer and a second capacitive layer.

The first capacitive layer is located on the surface of the substrate and includes a plurality of first capacitances. The first capacitances are respectively connected to different conductive contact plugs.

The second capacitive layer is located on a side of the first capacitive layer facing away from the substrate and includes a plurality of second capacitances. The second capacitances are respectively connected to different conductive contact plug. The conductive contact plugs connected to the second capacitances and the conductive contact plugs connected to the first capacitances are different conductive contact plugs.

In an exemplary embodiment of the disclosure, the first capacitive layer includes a plurality of first capacitances.

The first capacitances are distributed at intervals, and each of the first capacitances is in contact connection with the conductive contact plug.

In an exemplary embodiment of the disclosure, the first capacitive layer includes a first support layer. The first capacitance includes a lower electrode layer, a dielectric layer, and an upper electrode layer. The first support layer is coated at a periphery of a side of the lower electrode layer close to the substrate. The dielectric layer is formed on a surface of the lower electrode layer, and the upper electrode layer is formed on a surface of the dielectric layer.

In an exemplary embodiment of the disclosure, the semiconductor structure further includes a first semiconductor layer.

The first semiconductor layer covers the first capacitive layer, and is filled up a gap in the first capacitance and a gap between the first capacitances.

In an exemplary embodiment of the disclosure, a via penetrates and is formed in the first semiconductor layer and the first support layer. An orthographic projection of the via on the substrate is not overlapping with an orthographic projection of the first capacitance hole, and at least one conductive contact plug is exposed from each via.

The semiconductor structure further includes an insulation material layer and a conductive column.

The insulation material layer is formed on a sidewall of the via.

The conductive column is located in the via. The insulation material layer is in contact connection with a sidewall of the conductive column.

The second capacitive layer includes a plurality of second capacitances.

The second capacitances are located on sides of the first semiconductor layer and the conductive column facing away from the substrate, distributed at intervals, and are in one-to-one correspondence with and connected to the conductive columns.

In an exemplary embodiment of the disclosure, the second capacitive layer includes a second support layer. The second capacitance includes a lower electrode layer, a dielectric layer, and an upper electrode layer. The second support layer is coated at a periphery of a side of the lower electrode layer close to the substrate. The dielectric layer of the second capacitance is formed on a surface of the lower electrode layer of the second capacitance. The upper electrode layer of the second capacitance is formed on a surface of the dielectric layer of the second capacitance.

In an exemplary embodiment of the disclosure, the semiconductor structure further includes a second semiconductor layer.

The second semiconductor layer covers the second capacitive layer. The second semiconductor layer is filled up a gap in the second capacitance and a gap between the second capacitances. The second semiconductor layer is in contact connection with the first semiconductor layer.

According to an aspect of the disclosure, a memory is provided. The memory includes any of the above semiconductor structures.

For the memory, the semiconductor structure and the method for forming the same provided in the disclosure, in an aspect, the number of capacitances is increased by designing the plurality of capacitive layers. During using, the capacitances in the plurality of capacitive layers may be simultaneously charged and discharged, so that the storage capacity of the capacitances can be increased. In another aspect, during capacitance layout, since the layout space of each layer is relatively large, the radial sizes of the capacitances in each layer may be appropriately increased, so that the superficial area of each capacitance is increased. Therefore, the storage capacity of capacitances can be further increased. During manufacturing, the height of each capacitive layer may be appropriately reduced, so that the difficulty of forming the capacitance holes through etching can be reduced, and the difficulty of coating the capacitance holes to form the capacitances is also reduced. In this way, it is guaranteed that each capacitance hole can be completely etched, so that each capacitance formed in the capacitance hole can be connected to a conductive structure at the bottom of the capacitance hole. Therefore, the charge collected by each capacitance can be guaranteed to be stored, and the failure or collapse of some capacitances due to hanging may also be prevented, thereby increasing product yield. In addition, there is no need to arrange the capacitances in hexagons, so that the conductive layer causing the capacitances to be arranged in hexagons may be prevented from being manufactured. Therefore, processes may be simplified, and a manufacturing cost may be reduced.

It should be understood that, the above general description and the following detailed description are merely exemplary and explanatory, and cannot limit the disclosure.

BRIEF DESCRIPTION OF THE DRAWINGS

Drawings are incorporated into the specification and constitute a part of the specification. The drawings illustrate embodiments in accordance with the disclosure and serve to understand the principles of the disclosure together with the specification. It is apparent that the drawings in the following descriptions are merely some embodiments of the disclosure. Other drawings can be obtained from those skilled in the art according to these drawings without any creative work.

Figure 1:
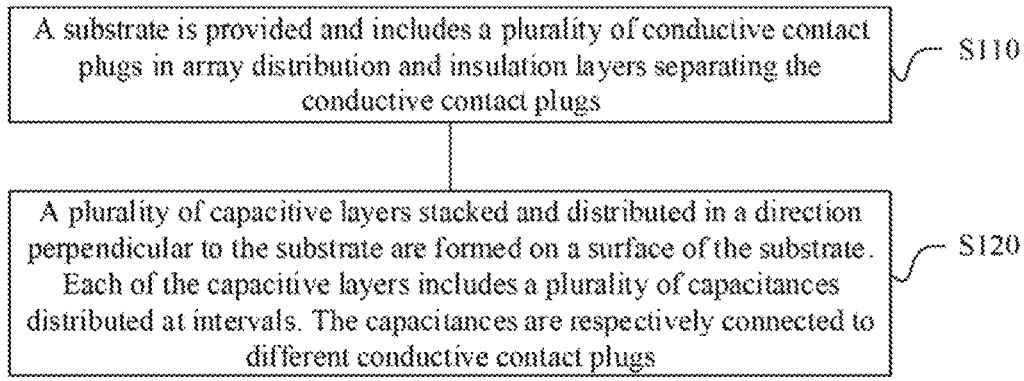
FIG. 1 shows a flowchart of a method for forming a semiconductor structure according to an embodiment of the disclosure.

In the drawings:
1. Substrate; 11. Conductive contact plug; 12. insulation layer; 13. Bit line structure; 101. Capacitance contact hole; 21. First capacitive layer; 211. First capacitance; 2111. Lower electrode layer of first capacitance; 2112. Dielectric layer of first capacitance; 2113. Upper electrode layer of first capacitance; 212. First stacked film layer; 2120. First capacitance hole; 2121. First support layer; 2122. First sacrificial layer; 2123. First mask layer; 22. Second capacitive layer; 221. Second capacitance 2211. Lower electrode layer of second capacitance; 2212. Dielectric layer of second capacitance; 2213. Upper electrode layer of second capacitance; 222. Second stacked film layer; 2220. Second capacitance hole; 2221. Reference support layer; 2222. Second sacrificial layer; 2223. Third mask laver; 3. First semiconductor layer; 310. Second mask layer; 301. Via; 4. Conductive column; 5. Second semiconductor layer.

DETAILED DESCRIPTION

Exemplary embodiments are described more comprehensively with reference to the drawings. However, exemplary embodiments can be implemented in various forms and should not be construed as limited to the embodiments set forth herein. In contrast, these embodiments are provided for more thorough and complete understanding of the disclosure, and to fully convey the concept of the exemplary embodiments to a person skilled in the art. The same reference numerals in the drawings denote same or similar structures, and thus detailed descriptions will be omitted. In addition, the drawings are merely schematic illustrations of the disclosure and are not necessarily drawn to scale.

Although relative terms such as "on" and "under" are used in this specification to describe a relative relationship of one component of an icon to another component, these terms are used in this specification only for convenience, for example, according to a direction of the example described in the drawings. It ma, be understood that, if the device in the drawings is turned over, then the component described as "on" other components may be oriented "under" the other component. When a certain structure is "on" other structures, it may mean that the certain structure is integrally formed on other structures, or that the certain structure is "directly" disposed on other structures, or that the certain structure is "indirectly" disposed on other structures by using another structure.

The terms "a", "an", "the", "said" and "at least one" are used to indicate the presence of one or wore elements/components/and the like. The terms "including" and "having" are used to indicate an open-ended inclusive meaning and mean that additional elements/components/and the like may be present in addition to the listed elements/components/and the like. The terms "first", "second", "third", and the like are merely used as marks and are not intended to limit the number of objects.

With the development of the semiconductor technology, people have huge requirements for small and integrated memories. As a core component of the memory, a capacitor is mainly configured to store charges. With the miniaturized in the size of the memory, it becomes increasingly difficult to achieve same capacitances or obtain larger capacitances. It may be learned from a capacitance formula $$\left( C = \frac{K_{highK}\varepsilon_0 A}{t_{highK}} = \frac{3.9\varepsilon_0 A}{t_{eq}}, A = 2\pi r^* h \right)$$

that, when materials having a same dielectric constant are used, the storage capacity of the capacitance may be increased only by reducing the thickness of the dielectric layer and increasing the superficial area of the capacitance. However, the reducing of the thickness of the dielectric layer is easy to cause a high leakage current and low product yield.

In the related art, the storage capacity of the capacitance is increased by increasing the superficial area of the capacitance. During the manufacturing of the capacitor, it is required to dispose a conductive layer at a capacitance array area, so that the capacitors are arranged in hexagons. In addition, a support layer and a sacrificial layer that overlap with each other are required to be formed on the substrate. The support layer and the sacrificial layer are etched to form a porous structure having a high aspect ratio (generally, the depth of the porous structure ranges from 1000 nm to 1500 nm). Then, the sacrificial layer is removed after the capacitors are formed. However, limited by a manufacturing process, the film etching depth varies in different etching areas during the formation of the porous structure having the high aspect ratio. After the sacrificial layer is removed, parts of the capacitances are invalid due to hanging, which are easy the collapse of these parts of the capacitances, lowering the device yield.

Based on this, the disclosure provides a method for forming a semiconductor structure to resolve the above technical problem. FIG. 1 shows a flowchart of a method for forming a semiconductor structure according to an embodiment of the disclosure. As shown in FIG. 1, the formation method may include S110 and S120.

At S110, a substrate is provided and includes a plurality of conductive contact plugs in array distribution and insulation layers separating the conductive contact plugs.

At S120, a plurality of capacitive layers stacked and distributed in a direction perpendicular to the substrate are formed on a surface of the substrate. Each of the capacitive layer includes a plurality of capacitances distributed at intervals. The capacitances are respectively connected to different conductive contact plugs.

According to the method for forming a semiconductor structure, in an aspect, the number of capacitances is increased by designing the plurality of capacitive layers. During using, the capacitances in the plurality of capacitive layers may be simultaneously charged and discharged, so that the storage capacity of the capacitances can be increased. In another aspect, during capacitance layout, since the layout space of each layer is relatively large, the radial sizes of the capacitances in each layer may be appropriately increased, so that the superficial area of each capacitance is increased. Therefore, the storage capacity of capacitances can be further increased. During manufacturing, the height of each capacitive layer may be appropriately reduced, so that the difficulty of forming the capacitance holes through etching can be reduced, and the difficulty of coating the capacitance holes to form the capacitances is also reduced. In this way, it is guaranteed that each capacitance hole can be completely etched, so that each capacitance formed in the capacitance hole can be connected to a conductive structure at the bottom of the capacitance hole. Therefore, the charges collected by each capacitance can be guaranteed to be stored, and the failure or collapse of some capacitances due to hanging may also be prevented, thereby increasing product yield. In addition, there is no need to arrange the capacitances in hexagons, so that the conductive layer causing the capacitances to be arranged in hexagons may be prevented from being manufactured. Therefore, processes may be simplified, and a manufacturing cost may be reduced.

Steps of the method for forming a semiconductor structure according to the embodiment of the disclosure are described in detail below.

As shown in FIG. 1, at S110, the substrate is provided and includes the plurality of conductive contact plugs in array distribution and the insulation layers separating the conductive contact plugs.

Figure 2:
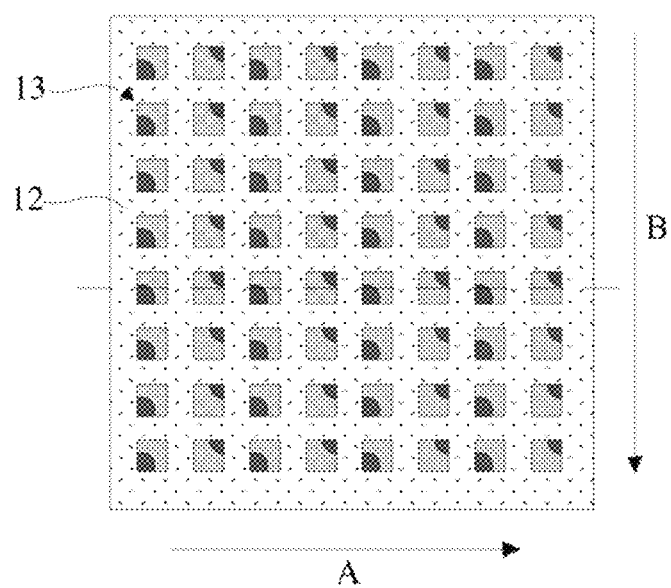
FIG. 2 shows a top view of a substrate according to an embodiment of the disclosure.
Figure 3:
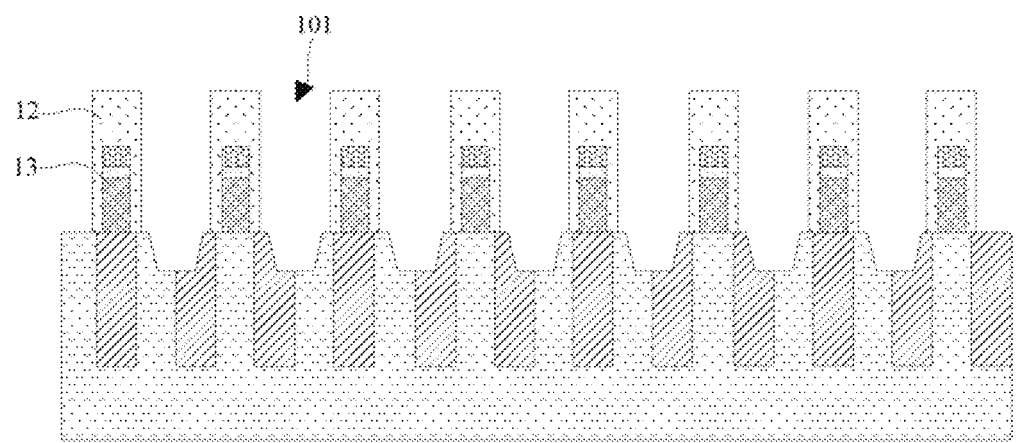
FIG. 3 schematically shows a substrate according to an embodiment of the disclosure.

FIG. 2 shows a top view of a substrate according to an embodiment of the disclosure. FIG. 3 shows a cross-sectional view of a substrate cut along a dotted line in FIG. 2. As shown in FIG. 2 and FIG. 3, the substrate 1 may be in a flat plate structure and includes a bit line structure 13. A formation area of the bit line structure 13 and a formation area of a capacitance contact hole 101 may be predefined on the substrate 1. The formation area of the bit line structure 13 may be configured to form the bit line structure 13. The formation area of the capacitance contact hole 101 may be configured to form the conductive contact plug.

Figure 4:
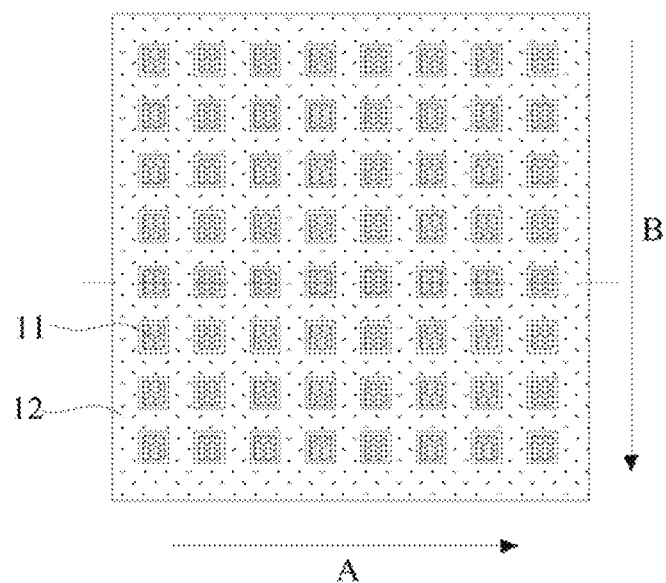
FIG. 4 shows a top view after S110 is completed according to an embodiment of the disclosure.
Figure 5:
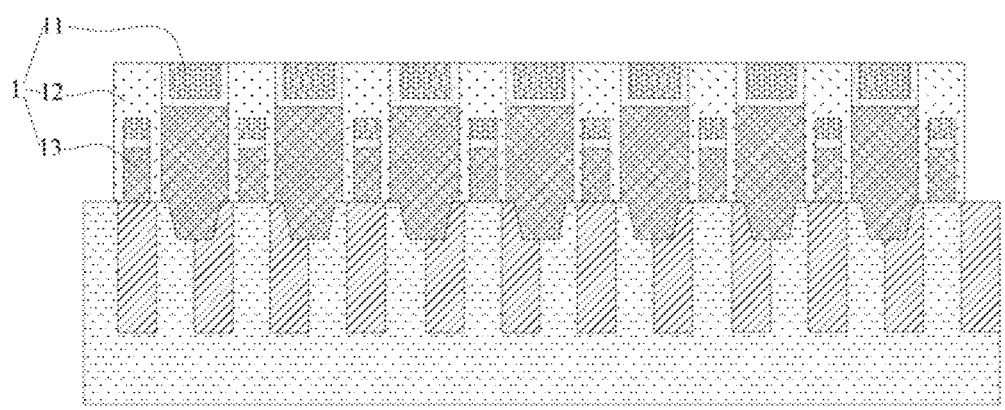
FIG. 5 schematically shows a structure after S110 is completed according to an embodiment of the disclosure.

FIG. 4 schematically shows a structure after S110 is completed according to an embodiment of the disclosure. FIG. 5 shows a cross-sectional view of a conductive contact plug cut along a dotted line in FIG. 4. As shown in FIG. 4 and FIG. 5, the substrate f may include an insulation layer 12. The insulation layer 12 may cover a top and sidewall of the hit line structure 13. For example, after the bit line structure 13 is formed in the formation area of the hit line structure 13, an insulation layer 12 material may be deposited on a surface of the bit line structure 13, so that the insulation layer 12 is formed. Then the insulation material is etched at portions corresponding to the formation areas of the capacitance contact holes 101, so as to form a plurality of capacitance contact holes 101 distributed at intervals in the insulation layer 12, and the conductive contact plugs 11 are formed in the capacitance contact holes 101. The conductive contact plugs 11 may be separated by using the insulation layer 12, to avoid the coupling or short circuit between the conductive contact plugs 11.

The conductive contact plugs 11 may be formed by conductors or semiconductor materials. For example, the materials may be tungsten, copper, polysilicon, or the like. The conductive contact plugs 11 may be formed in the capacitance contact holes 101 by means of vacuum evaporation, magnetron sputtering, chemical vapor deposition, physical vapor deposition, or atomic layer deposition. Definitely, the conductive contact plugs 11 may also be formed in other manners, which are not listed herein.

As shown in FIG. 2, in the disclosure, a plurality of sets of conductive contact plugs 11 distributed at intervals in a first direction A may be included. For example, the conductive contact plugs 11 in each set may be equidistantly distributed at intervals in the first direction A. The plurality of sets of conductive contact plugs 11 may be distributed at intervals in a second direction B. For example, each set of conductive contact plugs 1 may be equidistantly distributed at intervals in the second direction B. The first direction A may be perpendicular to the second direction B. That is to say, the conductive contact plugs 11 may be distributed in arrays in the form of rows and columns.

It is to be noted that, the expression "perpendicular to" may indicate a meaning "absolutely perpendicular to", or may indicate a meaning "substantively perpendicular to". However, there are inevitably deviations in the manufacturing process, in the disclosure, an angle deviation may be caused due to the limitation of the manufacturing process, so that an included angle between the first direction A and the second direction B has a certain deviation. However, as long as the angle deviation between the first direction A and the second direction B is within a preset range, it may be considered that the first direction A is perpendicular to the second direction B. For example, the preset range may be 10°. That is to say, when the included angle between the first direction A and the second direction B is within a range between 80° and 100°, it may be considered that the first direction A is perpendicular to the second direction B.

As shown in FIG. 1, at S120, the plurality of capacitive layers stacked and distributed in the direction perpendicular to the substrate are formed on the surface of the substrate. Each of the capacitive layers includes the plurality of capacitances distributed at intervals. The capacitances are respectively connected to different conductive contact plugs.

The capacitive layer may include a plurality of capacitances. The plurality of capacitances may be arranged at intervals and distributed in arrays. For example, the number of the capacitances in each capacitive layer may be two, four, six, eight, or ten. Definitely, there may be more capacitances, which is not listed herein. There may be a plurality of capacitive layers. The plurality of capacitive layers may be stacked and distributed in a direction perpendicular to the substrate 1. For example, the number of the capacitive layers may be two, three, four, or five. Definitely, other number of the capacitive layers may also be available, which is not listed herein.

In an exemplary embodiment of the disclosure, the capacitances in the two adjacent capacitive layers may be staggered, and capacitances may be directly or indirectly connected to different conductive contact plugs 11, so that the charges collected in the capacitances is stored by using the conductive contact plugs 11. During using, the capacitances in the plurality of capacitive layers may be simultaneously charged and discharged, so that the storage capacity of capacitances can be increased. During capacitance layout, the layout space of each capacitive layer is relatively large, and the radial sins of the capacitances in each capacitive layer may be appropriately increased, so that the superficial area of each capacitance is increased. Therefore, the storage capacity of the capacitances can be further increased.

For example, the plurality of capacitive layers may be formed on the surface of the substrate 1 by means of vacuum evaporation, magnetron sputtering, chemical vapor deposition, physical vapor deposition, or atomic layer deposition. Definitely, the capacitive layers may also be formed in other forms. The manner of forming the capacitive layers is not particularly limited herein.

Figure 6:
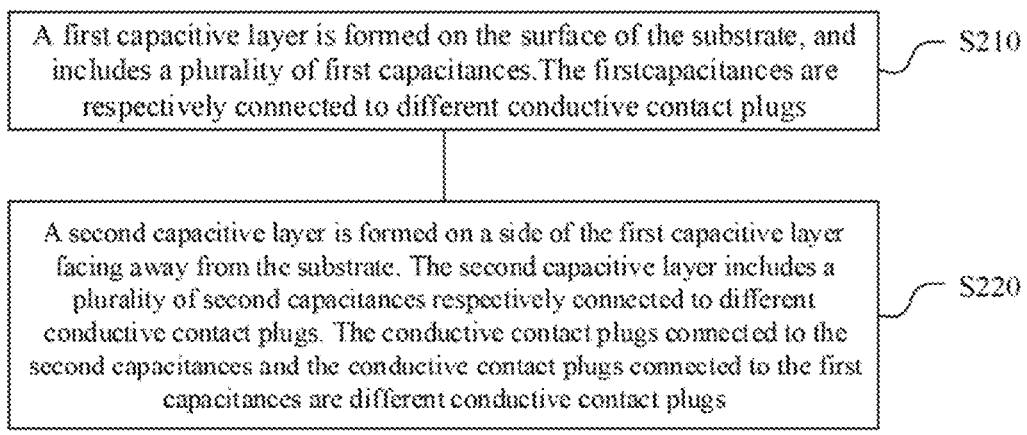
FIG. 6 shows a flowchart of S120 according to an embodiment of the disclosure.

In an exemplary embodiment of the disclosure, the number of the capacitive layers may be two, which may be a first capacitive layer 21 and a second capacitive layer 22, respectively. The plurality of capacitive layers stacked and distributed in the direction perpendicular to the substrate 1 are formed on the surface of the substrate 1. Each capacitive layer includes the plurality of capacitances distributed at intervals, and the capacitances are respectively connected to different conductive contact plugs 11. That is to say, S120 may include S210 and S220, as shown in FIG. 6.

At S210, the first capacitive liver is formed on the surface of the substrate. The first capacitive layer includes a plurality of first capacitances, and the first capacitances are respectively connected to different conductive contact plugs.

Figure 7:
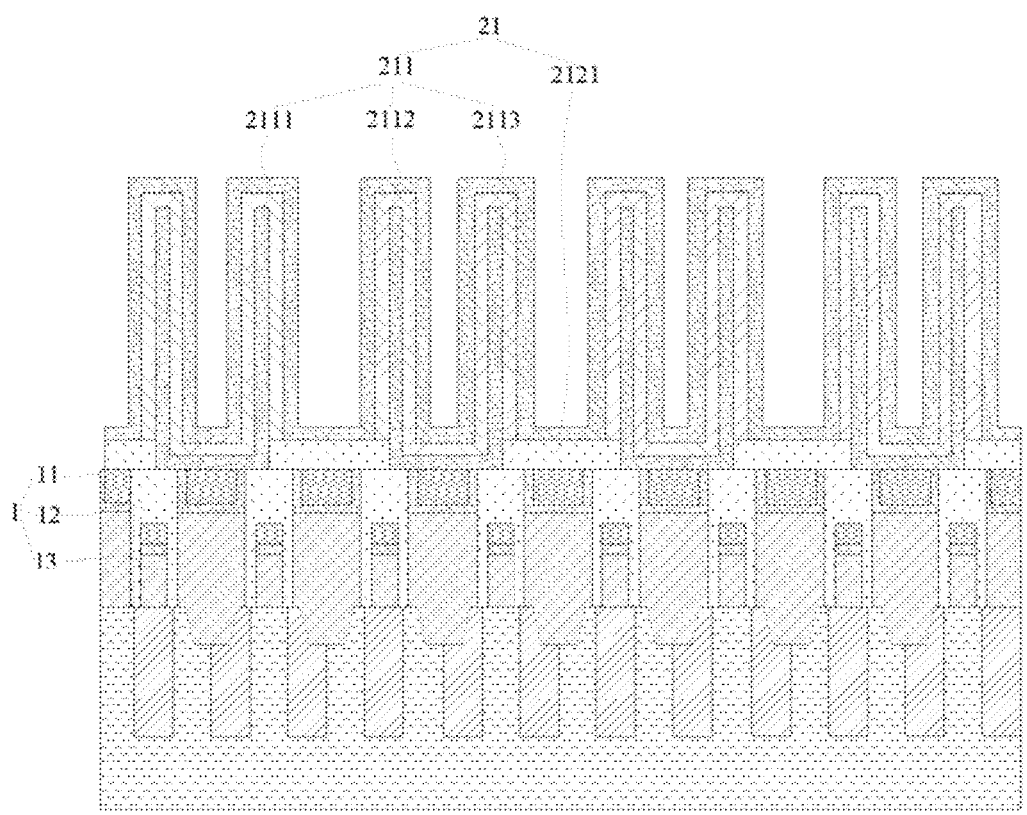
FIG. 7 schematically shows a first capacitive layer according to an embodiment oldie disclosure.

As shown in FIG. 7, the first capacitive layer 21 may include the plurality of first capacitances 211 distributed at intervals. The cross section of each first capacitance 211 may be circular, triangular or square, which is not particularly limited herein.

In an embodiment of the disclosure, the superficial area of each first capacitance 211 may be appropriately increased. By using the first capacitance 211 with the cross section of circular as an example, the circumference of each first capacitance 211 may be lengthened by 20% to 60% of the circumference of an original capacitance. Since the capacity of the capacitance is proportional to the superficial area of the capacitance, an etching height of the first capacitance 211 may be reduced by 20% to 60% without changing the capacity of the first capacitance 211, so that the difficulty of forming the first capacitance hole may be reduced, and the difficulty of coating the first capacitance hole to form the first capacitance 211 may also be reduced. In this way, it is guaranteed that each first capacitance hole can be completely etched, so that each first capacitance 211 formed in the first capacitance hole can be connected to the conductive contact plug 11. Therefore, charge collected by each first capacitance 211 can be guaranteed to be stored, and the failure or collapse of some first capacitances 211 due to hanging may also be prevented, thereby increasing product yield.

The conductive contact plug 11 may correspondingly be distributed under each first capacitance 211. An orthographic projection of each first capacitance 211 on the substrate 1 may at least partially overlap with the conductive contact plug 11 under the first capacitance. In the embodiment of the disclosure, the first capacitance 211 may be in contact connection with the conductive contact plug 11 under the first capacitance.

Figure 8:
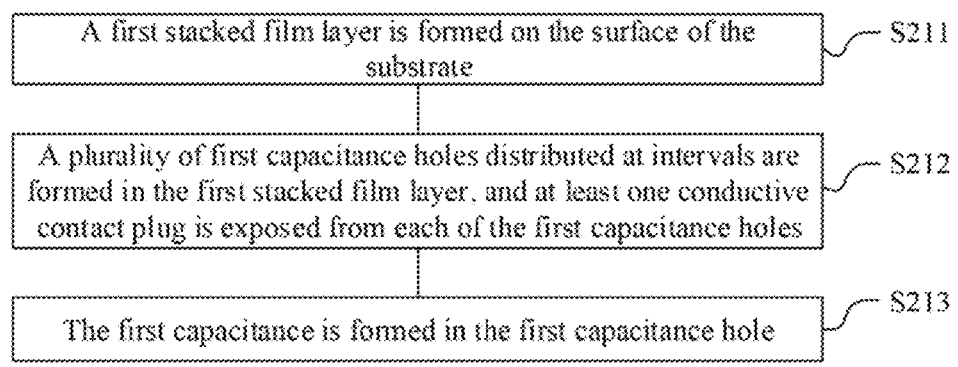
FIG. 8 shows a flowchart of S210 according to an embodiment of the disclosure.

In an exemplary embodiment of the disclosure, the first capacitive layer 21 is formed on the surface of the substrate 1. The first capacitive layer 21 includes the plurality of first capacitances 211. The first capacitances 211 are respectively connected to different conductive contact plugs 11. That is to say, S210 may include S211 to S213, as shown in FIG. 8.

At S211, a first stacked film layer is formed on the surface of the substrate.

Figure 9:
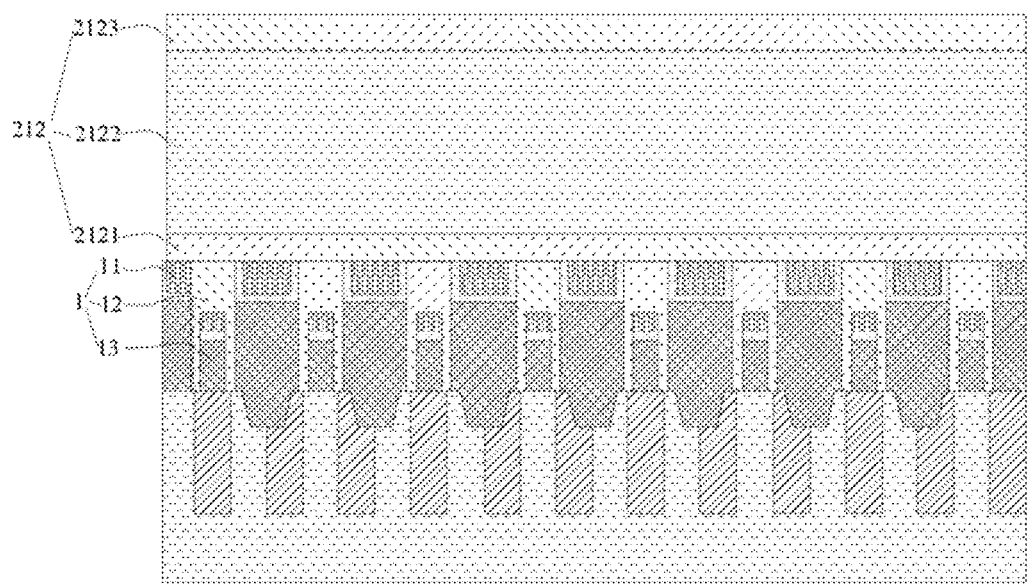
FIG. 9 schematically shows a structure after S211 is completed according to an embodiment of the disclosure.

As shown in FIG. 9, the first stacked film layer 212 may include a first support layer 2121, a first sacrificial layer 2122, and a first mask layer 2123 that are stacked and distributed in the direction perpendicular to the substrate 1. The first support layer 2121 is formed on the surface of the substrate 1. The first sacrificial layer 2122 is formed on a surface of the first support layer 2121 facing away from the substrate 1. The first mask layer 2123 is formed on a surface of the first sacrificial layer 2122 facing away from the substrate 1.

For example, the first support layer 2121, the first sacrificial layer 2122, and the first mask layer 2123 may be successively formed on the surface of the substrate 1 by means of chemical vapor deposition, physical vapor deposition, atomic layer deposition, vacuum evaporation, or magnetron sputtering. Definitely, the first support layer 2121, the first sacrificial layer 2122, and the first mask layer 2123 may also be formed in other manners. The manner of forming the first support layer 2121, the first sacrificial layer 2122, and the first mask layer 2123 is not particularly limited herein.

The first support layer 2121 may be a thin film formed on the surface of the substrate 1, of which material may be $Si_3N_4$ or SiCN and thickness may range from 20 nm to 200 nm. The first sacrificial layer 2122 may be a thin film formed on the surface of the first support layer 2121 facing away from the substrate 1, of which material may be $SiO_2$ or BPSG and thickness may range from 400 nm to 900 nm. The first mask layer 2123 may be a thin film or a coating formed on the surface of the first sacrificial layer 2122 facing away from the substrate 1. In an embodiment, the first mask layer 2123 may be an anti-reflective coating, of which material may be silicon, silicon nitride, silicon oxide or carbide. The specific material may be selected according to the design and requirements of a follow-up yellow light etching process. For example, the material of the first mask layer 2123 may be the same as the material of the first support layer 2121, For example, the material of the first mask layer 2123 and the material of the first support layer 2121 both are silicon oxide, and the thicknesses may range from 10 nm to 80 nm.

At S212, a plurality of first capacitance holes distributed at intervals are formed in the first stacked film layer, and at least one conductive contact plug is exposed from each first capacitance hole.

Figure 10:
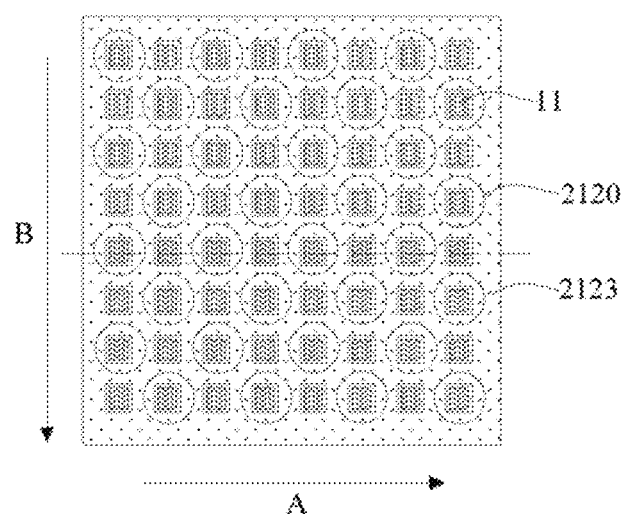
FIG. 10 shows a top view of a structure after S212 is completed according to an embodiment of the disclosure.
Figure 11:
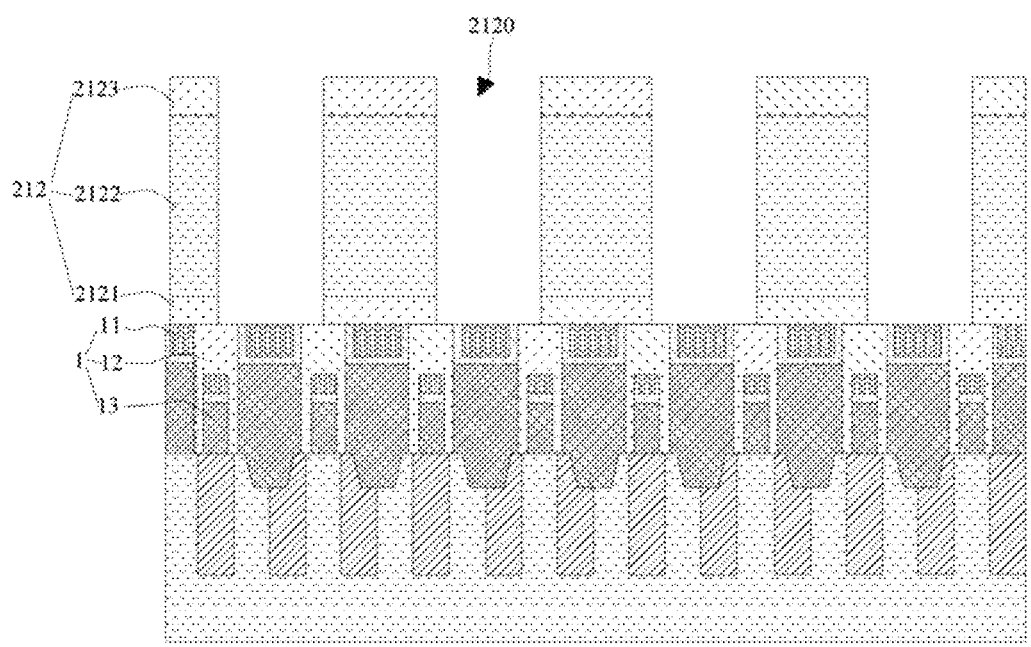
FIG. 11 shows a cross-sectional view of a structure after S212 is completed according to an embodiment of the disclosure.

A photoresist layer may be formed on a side of the first mask layer 2123 facing away front the substrate 1 by means of spin coating or other manners. A material of the photoresist layer may be a positive photoresist or a negative photoresist, which is not particularly limited herein. A shape of a surface of the photoresist layer away from the first mask layer 2123 may be the same as a shape of the surface of the first mask layer 2123. The photoresist layer may be exposed by using a mask. A pattern of the mask may match a pattern required for the first capacitance hole 2120. Then, the exposed photoresist layer may be developed to form a development area. The development area may be exposed from the first mask layer 2123. A pattern of the development area may be the same as a pattern required for the first capacitance hole 2120. A size of the development area may be the same as a size required for the first capacitance hole 2120. Dry etching may be performed on the first mask layer 2123, the first sacrificial layer 2122, and the first support layer 2121 at the development area by means of a bias voltage, to expose the conductive contact plug 11 corresponding to the first capacitance hole 2120. FIG. 10 is a top view of a structure after S212 is completed according to an embodiment of the disclosure. FIG. 11 is a schematic diagram of a structure after cutting along a dotted line in FIG. 10 according to an embodiment of the disclosure.

An etching gas of dry etching may include at least one gas of $SF_6$, $CF_x$, $Cl_2$, or Ar. For example, the etching gas may include Ar, or may include at least one gas of $SF_6$, $CF_x$, or $Cl_2$.

It is to be noted that, when there are N capacitive layers, in a row or column arrangement, at least N−1 conductive contact plugs 11 may be spaced between the two adjacent conductive contact plugs 11 in each capacitance hole. For example, when there are two capacitive layers, in the row or column arrangement, at least one conductive contact plug 11 is spaced between the two adjacent conductive contact plugs 11 corresponding to the first capacitive layer 21. That is to say, the conductive contact plug 11 corresponding to each capacitance in the first capacitive layer 21 and the conductive contact plug 11 corresponding to each capacitance in the second capacitive layer 22 are alternately arranged.

At S213, the first capacitance is formed in the first capacitance hole.

The first capacitance 211 may be formed in the first capacitance hole 2120 by means of vacuum evaporation, magnetron sputtering, chemical vapor deposition, physical vapor deposition, or atomic layer deposition. In order to increase the storage capacity of the capacitance, the first capacitance 211 may be designed as a double-sided capacitance.

Figure 12:
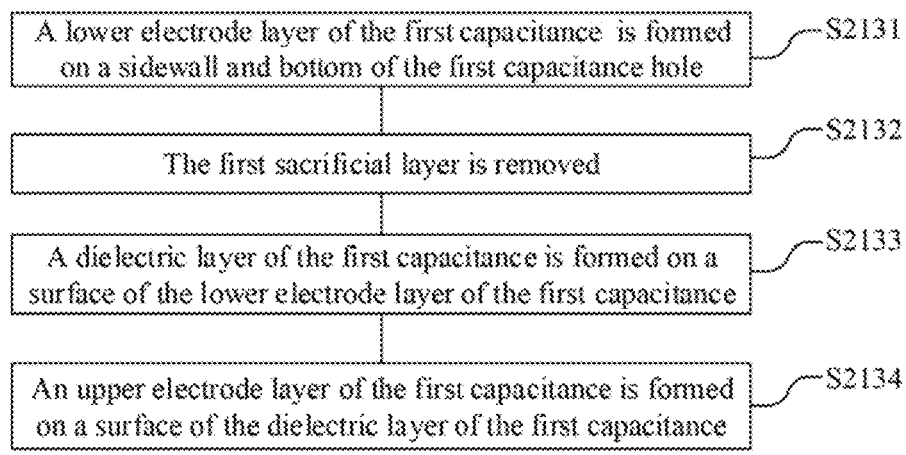
FIG. 12 shows a flowchart of S213 according to an embodiment of the disclosure.

In an exemplary embodiment of the disclosure, the first capacitance 211 is formed in the first capacitance hole 2120. That is to say, S213 may include S2131 to S2134, as shown in FIG. 12.

At S2131, a lower electrode layer of the first capacitance is formed on a sidewall and bottom of the first capacitance hole.

Figure 13:
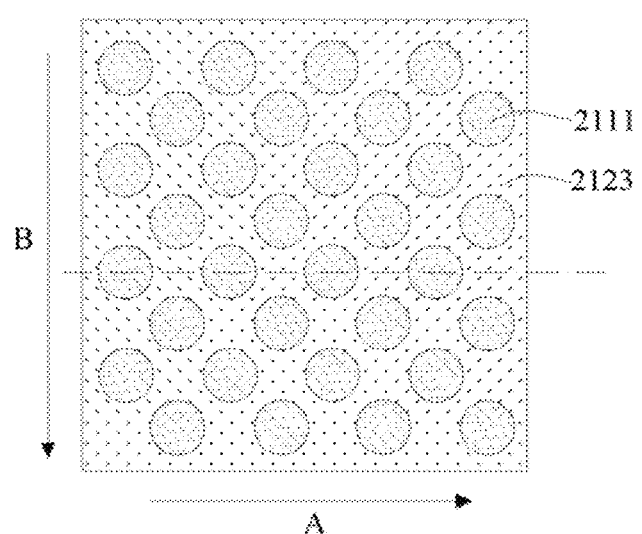
FIG. 13 shows a top view of a structure after S2131 is completed according to an embodiment of the disclosure.
Figure 14:
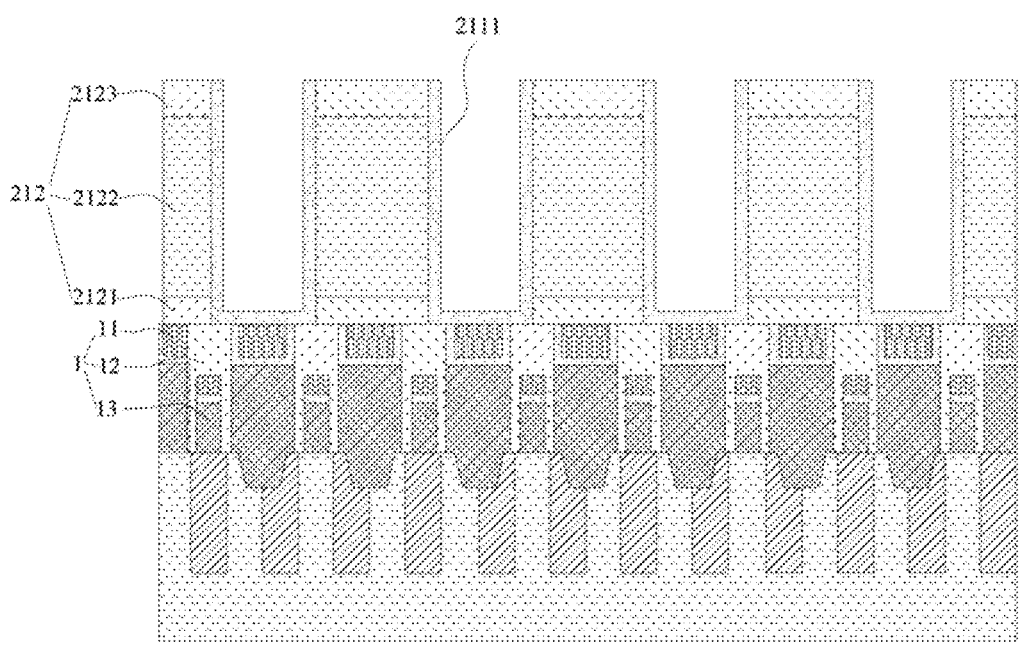
FIG. 14 shows a cross-sectional view of a structure after S2131 is completed according to an embodiment of the disclosure.

A lower electrode layer 2111 of the first capacitance 211 may be formed on a sidewall and bottom of the first capacitance hole 2120. Specifically, the lower electrode layer attached to surfaces of the bottom and sidewall of the first capacitance hole 2120 may be formed in the first capacitance hole 2120. For ease of a process, the lower electrode layer may be simultaneously formed in the first capacitance hole 2120 and the top surface of the first capacitance hole. Subsequently, the lower electrode layer on the top surface of the first capacitance hole 2120 may be removed, and only the lower electrode layer at the bottom and sidewall is retained. In addition, the lower electrode layer 2111 of the first capacitance 211 may be in contact connection with the conductive contact plug 11 through the first capacitance hole 2120, to input electric quantities stored in the lower electrode layer 2111 of the first capacitance 211 into the conductive contact plug 11, so that capacitance storage is realized. FIG. 13 is a top view of a structure after S2131 is completed according to an embodiment of the disclosure. FIG. 14 is a schematic diagram of a structure after cutting along a dotted line in FIG. 13 according to an embodiment of the disclosure.

For example, the lower electrode layer 2111 of the first capacitance 211 may be formed in the first capacitance hole 2120 by means of vacuum evaporation, magnetron sputtering, chemical vapor deposition, physical vapor deposition, or atomic layer deposition. Definitely, the lower electrode layer 2111 of the first capacitance 211 may also be formed in other manners. A material of the lower electrode layer 2111 of the first capacitance 211 may be titanium, titanium nitride, or tungsten, or may be other materials that may be used as electrodes, definitely. The material and process for forming the lower electrode layer 2111 of the first capacitance 21 are not particularly limited herein.

Figure 15:
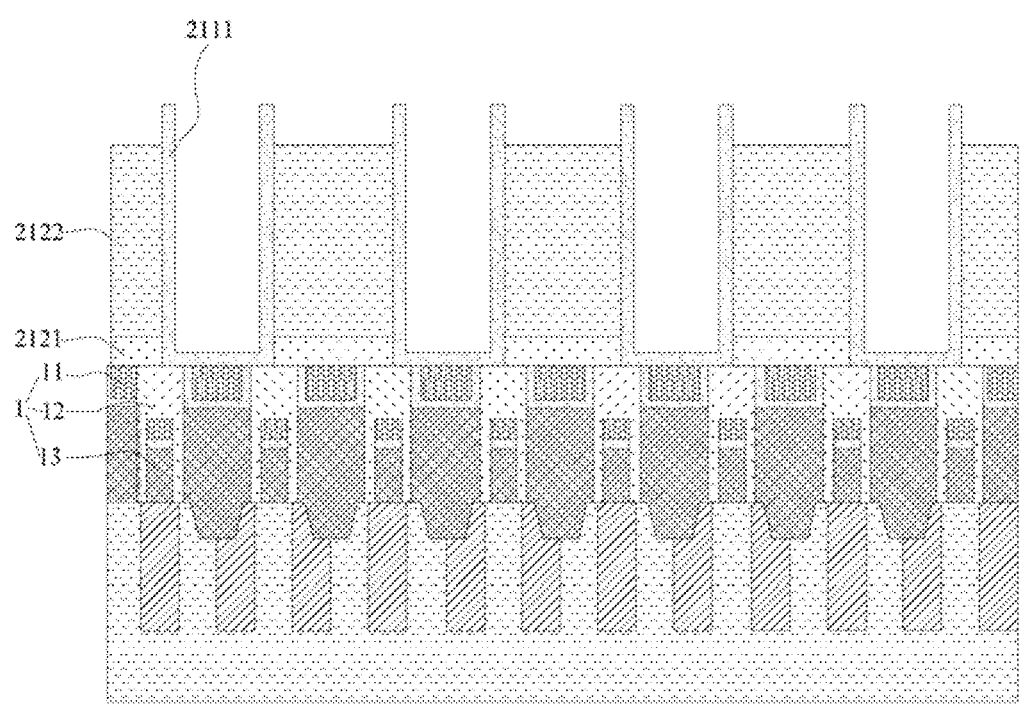
FIG. 15 schematically shows a structure after a first mask layer is removed according to an embodiment of the disclosure.

It is to be noted that, the first mask layer 2143 may be removed after the lower electrode layer 2111 of the first capacitance 211 is formed, so as to expose the first sacrificial layer 2122. For example, the first mask layer 2123 may be removed by means of dry etching. Definitely, the first mask layer 2123 may also be removed in other manners. The manner of removing the first mask layer 2123 is not particularly limited herein. In an embodiment of the disclosure, a structure after the first mask layer is removed is shown in FIG. 15.

At S2132 the first sacrificial layer is removed.

The first sacrificial layer 2122 may be removed after the lower electrode layer 2111 of the first capacitance 211 is formed, and the first support layer 2121 is retained. In this case, the first support layer 2121 is coated on a periphery of the lower electrode layer 2111 of the first capacitance 211. In this way, the storage density of the capacitance may be increased, and the bottom of the lower electrode layer 2111 of the first capacitance 211 may be supported. Therefore, the lower electrode layer 2111 of the first capacitance 211 is prevented from deforming outwards, thereby reducing a short circuit risk.

For example first sacrificial layer 2122 may be removed by means of wet etching. For example, wet etching may be performed by using an acid solution. For example, the acid solution may be hydrofluoric acid, or may be Buffered Hydrofluoric Acid (BHF), 49% hydrofluoric acid or Diluted Hydrofluoric Acid (DHF). When the DHF is used as the etching; solution, a preparation ratio of the hydrofluoric acid to deionized water may be 1:1 to 1:10. The preparation ratio and concentration of the etching solution are not particularly limited herein.

At S2133, dielectric layer of the first capacitance is formed on a surface the lower electrode layer of the first capacitance.

The dielectric-layer 2112 of the first capacitance 211 may be formed on the surface of the lower electrode layer 2111 of the first capacitance 211. For example, the dielectric layer 2112 of the first capacitance 211 may be a thin film that is formed on the surface of the lower electrode layer 2111 of the first capacitance 211. The dielectric layer 2112 of the first capacitance 211 may be formed by means of vacuum evaporation, magnetron sputtering, chemical vapor deposition, physical vapor deposition, or atomic layer deposition. Definitely, the dielectric layer 2112 of the first capacitance 211 may also be formed through other manners, which is not listed herein. The dielectric layer 2112 of the first capacitance 211 may be a monolayer film structure formed by a same material, or may be a mixed film layer structure formed by film layers of different materials. For example, the dielectric layer may include materials having dielectric constants. For example, the materials may be alumina, hafnium oxide, lanthanum oxide, titanium oxide, zirconium oxide, tantalum oxide, niobium oxide, strontium oxide, silicon nitride, or mixtures thereof or may definitely be other materials, which are not listed herein.

At S2134, an upper electrode layer of the first capacitance is formed on a surface of the dielectric layer of the first capacitance.

For example, the upper electrode layer 2113 of the first capacitance 211 may be formed on a surface of the dielectric layer 2112 of the first capacitance 211 by means of vacuum evaporation, magnetron sputtering, chemical vapor deposition, physical vapor deposition, or atomic layer deposition. Definitely, the upper electrode layer 2113 of the first capacitance 211 may also be formed through other processes, which is not particularly limited herein. A material of the upper electrode layer 2113 of the first capacitance 211 may be a conductive material. For example, the material may be titanium, titanium nitride, or tungsten, or may be other materials that may be used as electrodes, definitely. The material and process for forming the upper electrode layer 2113 of the first capacitance 211 are not particularly limited herein, in an embodiment of the formation method of the disclosure, a structure after S2134 is completed is shown in FIG. 7.

At S220, a second capacitive layer is formed on a side of the first capacitive layer facing away from the substrate. The second capacitive layer includes a plurality of second capacitances. The second capacitances are respectively connected to different conductive contact plugs. The conductive contact plugs connected to the second capacitances and the conductive contact plugs connected to the first capacitances are different conductive contact plugs.

Figure 16:
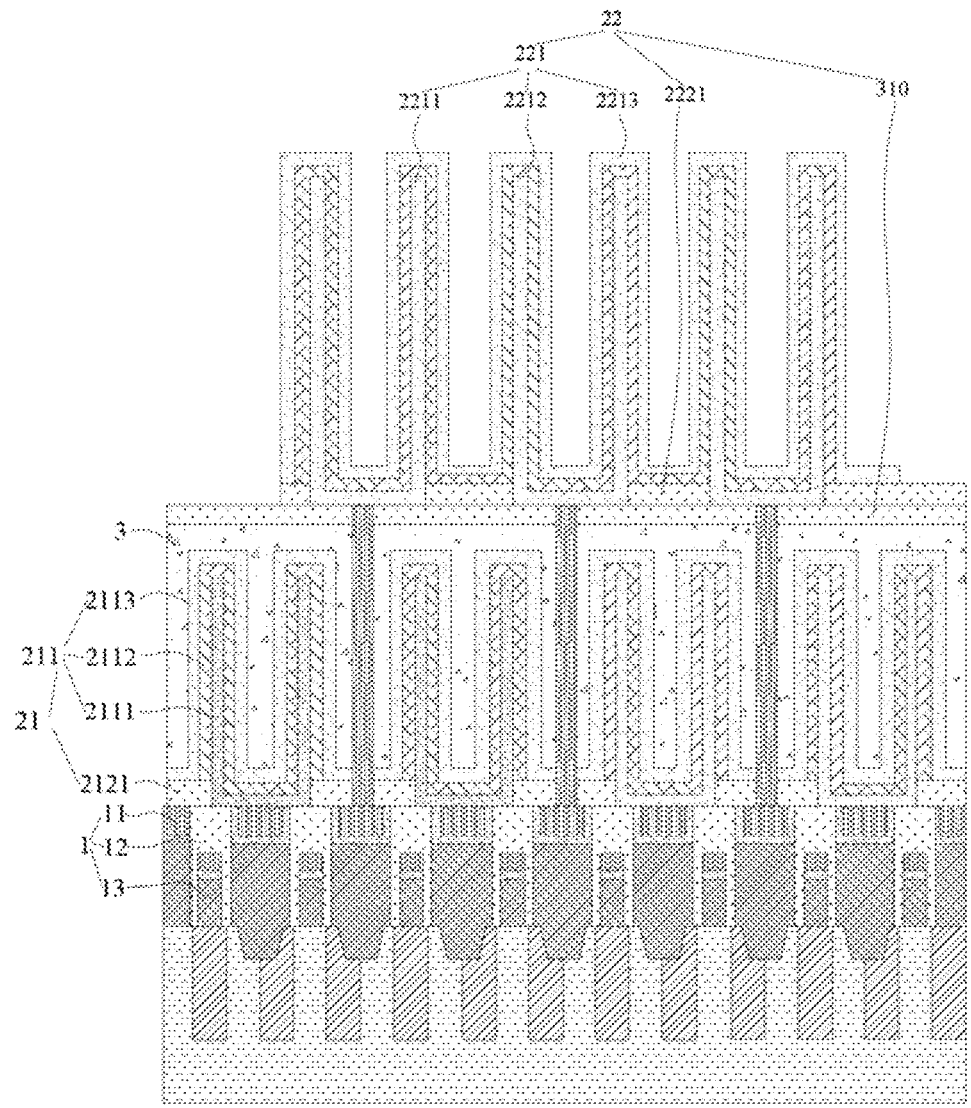
FIG. 16 schematically shows a structure after S220 is completed according to an embodiment of the disclosure.

The second capacitive layer 22 may be disposed on the side of the first capacitive layer 21 facing away from the substrate 1. The second capacitive layer 22 may include the plurality of second capacitances 221 distributed at intervals. The cross section of each second capacitance 221 may be circular or square, which is not particularly limited herein. In an embodiment of the disclosure, a structure after S220 is completed is shown in FIG. 16.

In an embodiment of the disclosure, the superficial area of each second capacitance 221 may be appropriately increased. By using the second capacitance 221 with the cross section of circular as an example, the circumference of each second capacitance 221 may be lengthened by 20% to 60% of the circumference of an original capacitance. Since the capacity of the capacitance is proportional to the superficial area of the capacitance, an etching height of the second capacitance 221 may be reduced by 20% to 60% without changing the capacity of the second capacitance 221, so that the difficulty of forming the second capacitance hole may be reduced, and the difficulty of coating the second capacitance hole to form the second capacitance 221 may also be reduced. In this way, it is guaranteed that each second capacitance hole can be completely etched, so that each second capacitance 221 formed in the second capacitance hole can be connected to the conductive contact plug 11. Therefore, charge collected by each second capacitance 221 can be guaranteed to be stored, and the failure or collapse of some second capacitances 221 due to hanging ma also be prevented, thereby increasing product yield.

The conductive contact plug 11 may correspondingly be distributed under each second capacitance 221. An orthographic projection of each second capacitance 221 on the substrate 1 may at least partially overlap with the conductive contact plug 11 under the second capacitance. In this embodiment of the disclosure, the second capacitance 221 may be indirectly connected to the conductive contact plug 11 under the second capacitance by using other conductive structures.

Figure 17:
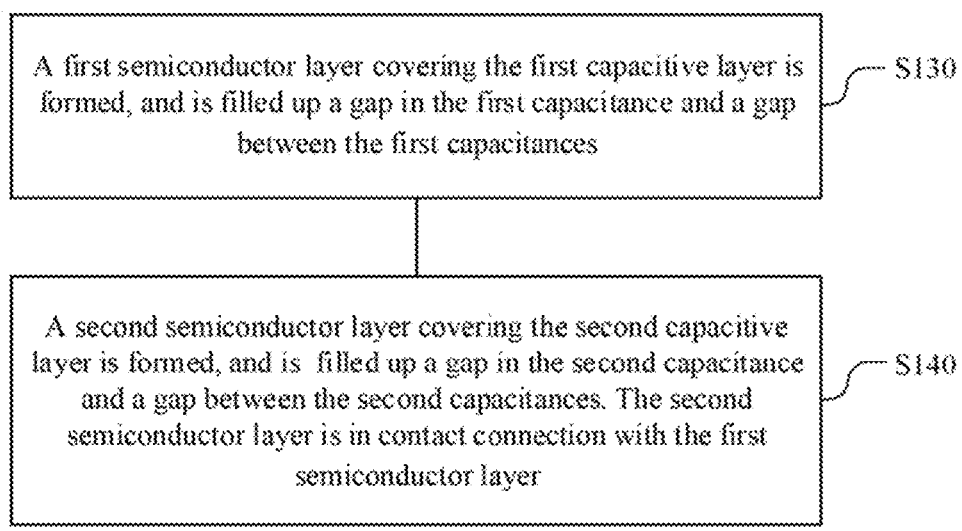
FIG. 17 shows a flowchart of a method for forming a semiconductor structure according to another embodiment of the disclosure.

In an exemplary embodiment of the disclosure, as shown in FIG. 17, the method for forming a semiconductor structure further includes the following steps.

At S130, a first semiconductor layer covering the first capacitive layer is formed, and is filled up a gap in the first capacitance and a gap between the first capacitances.

Figure 18:
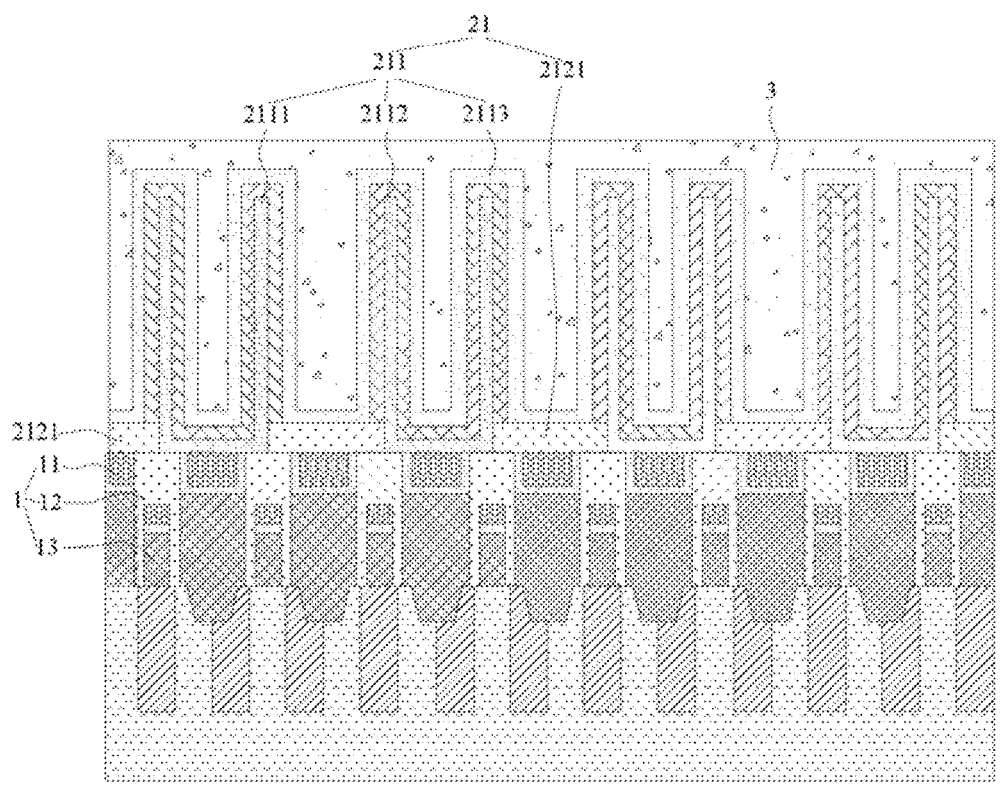
FIG. 18 schematically shows a structure after S130 is completed according to an embodiment of the disclosure.

After the first capacitive layer 21 is formed, the first semiconductor layer 3 covering the first capacitive layer 21 may be formed by means of vacuum evaporation, magnetron sputtering, chemical vapor deposition, physical vapor deposition, or atomic layer deposition. The first semiconductor layer 3 may be in complete contact with the upper electrode layer 2113 of each first capacitance 211, so as to facilitate the enhancement of the charging efficiency of the capacitance. Specifically, the first semiconductor layer 3 may cover the surface of the upper electrode layer 2113 of each first capacitance 211, and may be filled in the gap in the first capacitance 211 and the gap between the first capacitances 211. Therefore, the first capacitances 211 may be electrically led out, and the stability of the capacitances in the first capacitive layer 21 may also be improved. In an embodiment of the disclosure, a structure after S130 is completed is shown in FIG. 18.

The first semiconductor layer 3 may be formed by a silicon material, a metal material or a metal compound. For example, the silicon material, the metal material and the metal compound may be silicon, silicon germanium, tungsten, titanium suicide, titanium oxide, or tungsten oxide, which are not particularly limited herein.

In an embodiment, orthographic projections of the first support layer 2121 and each first capacitance 211 on the substrate 1 may be in an orthographic projection of the first semiconductor layer 3 on the substrate 1, so as to completely coat each first capacitance 211 by using the first semiconductor layer 3, thereby avoiding electric leakage.

Figure 19:
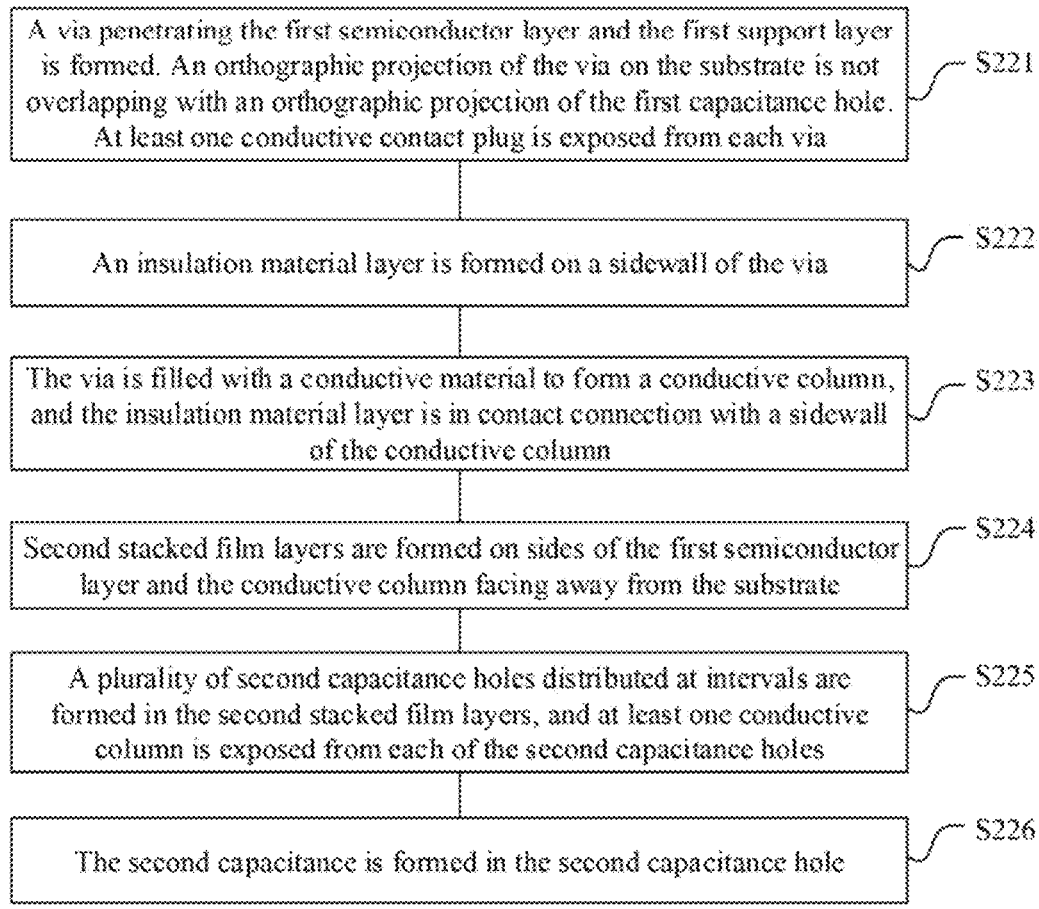
FIG. 19 shows a flowchart of S220 according to an embodiment of the disclosure.

In an exemplary embodiment of the disclosure, the second capacitive layer 22 is formed on the side of the first capacitive layer 21 facing away from the substrate 1. The second capacitive layer 22 includes the plurality of second capacitances 221. The second capacitances 221 are respectively connected to different conductive contact plugs 11. The conductive contact plugs 11 connected to the second capacitances 221 and the conductive contact plugs 11 connected to the first capacitances 211 are different conductive contact plugs 11. That is to say, S220 includes S221 to S226, as shown in FIG. 19.

At S221, a via penetrating the first semiconductor layer and the first support layer is formed. An orthographic projection of the via on the substrate is not overlapping with an orthographic projection of the first capacitance hole. At least one conductive contact plug is exposed from each via.

In an exemplary embodiment of the disclosure, the via 301 penetrating the first semiconductor layer 3 and the first support layer 2121 may be formed by means of etching. There may be a plurality of vias 301. At least one conductive contact plug 11 may be exposed from the bottom of each via 301. Preferably, one conductive contact plug 11 may be exposed from each via 301. The conductive contact plug 11 may be the conductive contact plug 11 other than the conductive contact plug 11 connected to the first capacitance 211.

For example, a second mask layer 310 may be formed on a surface of the first semiconductor layer 3 facing away from the substrate 1. The second mask layer 310 may be an anti-reflective coating, of which material may be an insulation material. For example, the material may be silicon, silicon nitride, silicon oxide or carbide. The specific material may be selected according to the design and requirements of a follow-up yellow light etching process. In an embodiment, the material of the second mask layer 310 may be the silicon nitride.

A photoresist layer may be formed on a surface of the second mask layer 310 facing away from the substrate 1 by means of spin coating or other manners. A material of the photoresist layer may be a positive photoresist or a negative photoresist, which is not particularly limited herein. The photoresist layer may be exposed by using a mask. A pattern of the mask may match a pattern required for the via 301. Then, the exposed photoresist layer may be developed to form a plurality of development areas. Each development area may be exposed from the second mask layer 310. A pattern of the development area may be the same as a pattern required for the via 301. A width of the development area mays be the same as a size required for the via 301.

Figure 20:
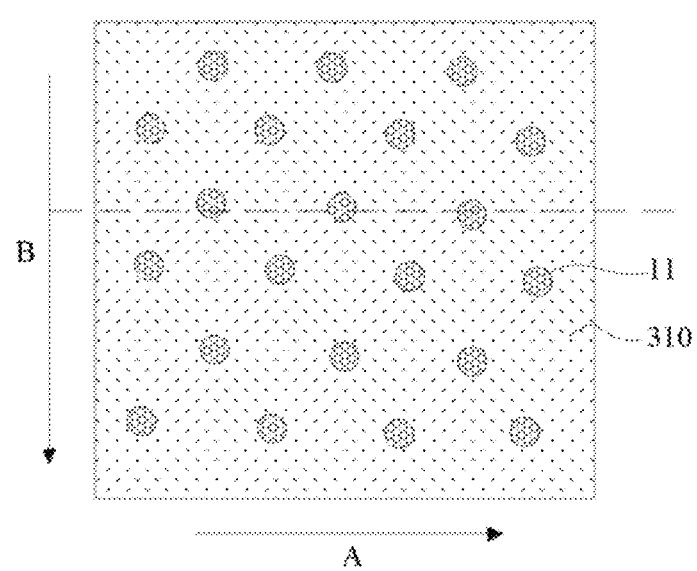
FIG. 20 shows a top view of a structure after S221 is completed according to an embodiment of the disclosure.
Figure 21:
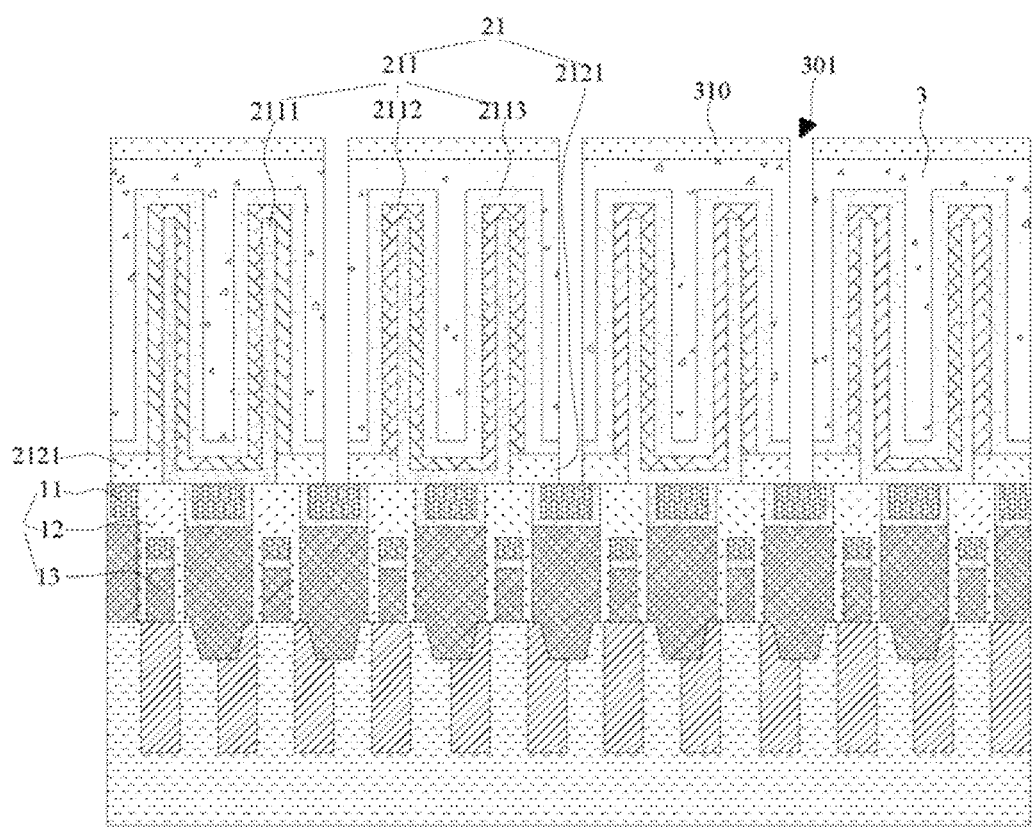
FIG. 21 shows a cross-sectional view of a structure after S221 is completed according to an embodiment of the disclosure.

Dry etching may be performed on the second mask layer 310, the first semiconductor layer 3, and the first support layer 2121 at the development areas by means of a bias voltage, to expose the conductive contact plugs 11. An etching gas of dry etching may include at least one gas of $SF_6$, $CF_x$, $Cl_2$, or Ar. For example, the etching gas may include Ar, or may include at least one gas of $SF_6$, $CF_x$, or $Cl_2$. FIG. 20 is a top view of a structure after S221 is completed according to an embodiment of the disclosure. FIG. 21 is a schematic diagram of a structure after cutting along a dotted line in FIG. 20 according to an embodiment of the disclosure.

At S222, an insulation material layer is formed on a sidewall of the via.

The insulation material layer may be formed on a sidewall of the via 301 by means of vacuum evaporation or chemical vapor deposition. A structure in the via 301 and the first semiconductor layer 3 may be isolated by using the insulation material layer, so that a short circuit due to electric leakage between the structure in the via 301 and the first semiconductor layer 3 is prevented. A material of the insulation material layer may be a material with a low dielectric constant, for example, may be SiCo, carbon-doped oxide, or silicon nitride. The thickness of the insulation material layer may range from to 3 mm. The material and thickness of the insulation material layer are not limited herein.

At S223, the via is filled with a conductive material to form a conductive column, and the insulation material layer is in contact connection with a sidewall of the conductive column.

The conductive material may be filled in the via 301 by means of vacuum evaporation, magnetron sputtering, chemical vapor deposition, physical vapor deposition, or atomic layer deposition. Definitely, the conductive material may also be filled in the via 301 through other manners. The manner of filling the conductive material is not particularly limited herein.

Figure 22:
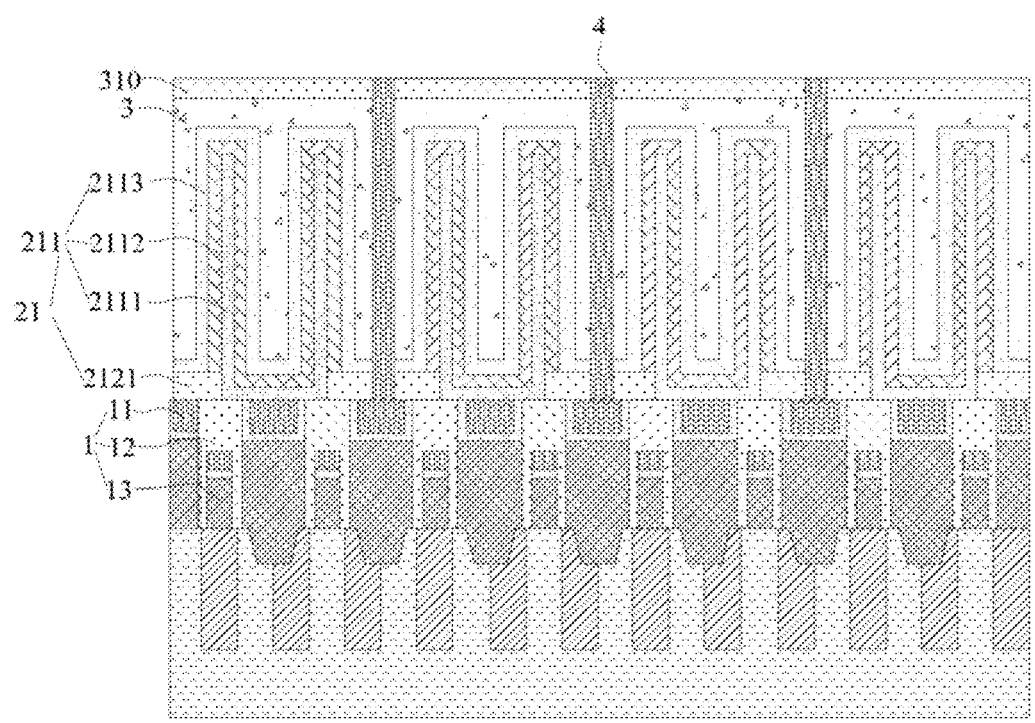
FIG. 22 schematically shows a structure after S223 is completed according to an embodiment of the disclosure.

In an embodiment, the conductive material may, be filled in the via 301, so as to form the conductive column 4 in the via 301. The conductive column 4 may be in contact connection with the conductive contact plug 11 at the bottom of the via 301. Therefore, the conductive contact plug 11 may be electrically led out by using the conductive column 4. The conductive material may be the same as the material of the conductive contact plug 11. For example, the conductive material may be tungsten. In an embodiment of the disclosure, a structure after S223 is completed is shown in FIG. 22.

At S224, second stacked film layers are formed on sides of the first semiconductor layer and the conductive column facing away from the substrate.

The second stacked film layer 222 may include a reference support layer 2221, a second sacrificial layer 2222, and a third mask layer 2223 that are stacked and distributed in the direction perpendicular to the substrate 1. The reference support layer 2221 is formed on a surface of the second mask layer 310. The second sacrificial layer 2222 is formed on a surface of the reference support layer 2221 facing away from the substrate 1. The third mask layer 2223 is formed on a surface of the second sacrificial layer 2222 facing away from the substrate 1.

For example, the reference support layer 2221, the second sacrificial layer 2222, and the third mask layer 2223 may be successively formed on the surface of the second mask layer 310 by means of chemical vapor deposition, physical vapor deposition, atomic layer deposition, vacuum evaporation or magnetron sputtering. Definitely, the reference support layer 2221, the second sacrificial layer 2222, and the third mask layer 2223 may also be formed through other manners. The manner of forming the reference support layer 2221, the second sacrificial layer 2222, and the third mask layer 2223 is not particularly limited herein.

Figure 23:
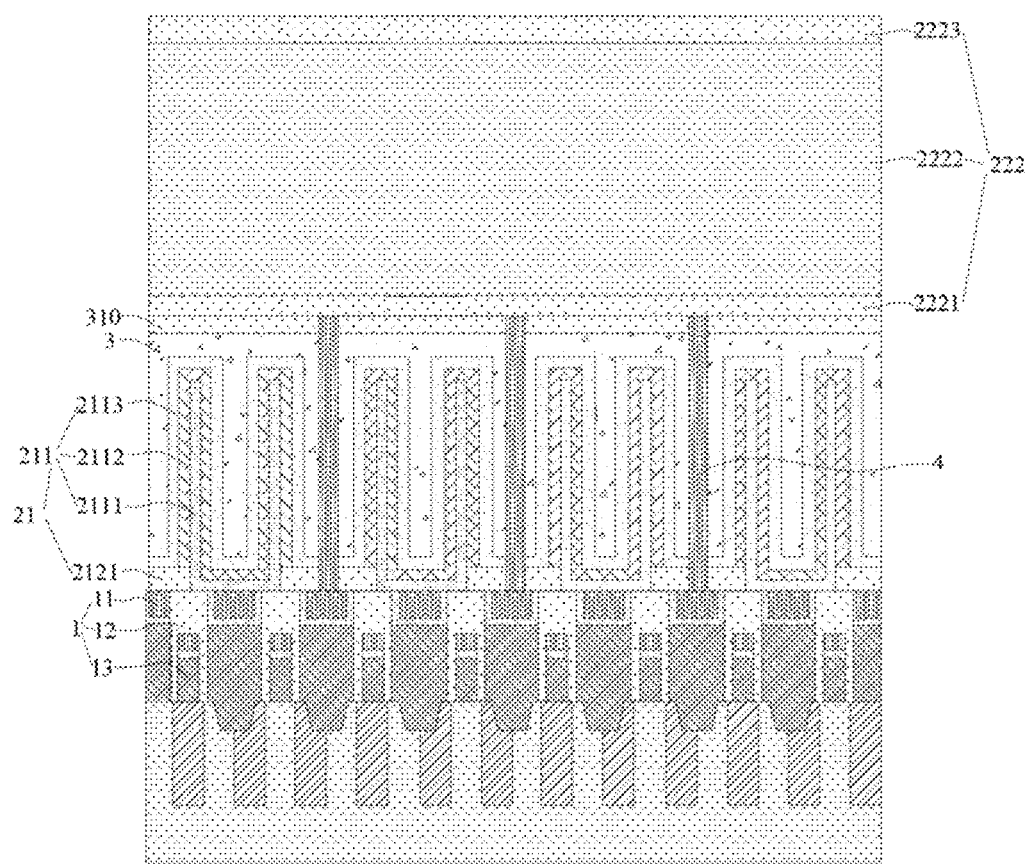
FIG. 23 schematically shows a structure after S224 is completed according an embodiment of the disclosure.

In an embodiment, the reference support layer 2221 may be a thin film formed on the surface of the second mask layer 310, of which material may be $Si_3N_4$ or SiCN and thickness may range from 20 nm to 200 nm. The reference support layer 2221 and the second mask layer 310 may have a same material. The reference support layer 2221 and the second mask layer 310 may jointly formed the second support layer. That is to say, the second stacked film layer 22.2 may include the second support layer and the second sacrificial layer 2222. The second sacrificial layer 2222 may be a thin film formed on the surface of the second support layer facing away from the substrate 1 of which material may be $SiO_2$ or BPSG and thickness may range from 400 nm to 900 nm. The third mask layer 2223 may be a thin film or a coating formed on the surface of the second sacrificial layer 2222 facing away from the substrate 1. For example, the third mask layer 2223 may be an anti-reflective coating. In an embodiment, the third mask layer 2223 may have a same material as the second support layer, of which thickness may range from 10 nm to 80 nm. In an embodiment of the disclosure, a structure after S224 is completed is shown in FIG. 23.

At S225, a plurality of second capacitance holes distributed at intervals are formed in the second stacked film layers, and at least one conductive column is exposed from each second capacitance hole.

A photoresist layer may be formed on a side of the third mask layer 2223 facing away from the substrate 1 by means of spin coating or other manners. A material of the photoresist layer may be a positive photoresist or a negative photoresist, which is not particularly limited herein. A shape of a surface of the photoresist layer away from the third mask layer 2223 may be the same as a shape of the surface of the third mask layer 2223. The photoresist layer may be exposed by using a mask. A pattern of the mask may match a pattern required for the second capacitance hole 2220. Then, the exposed photoresist layer may be developed to form a development area which may use for exposing the third mask layer 2223. A pattern of the development area may be the same as a pattern required for the second capacitance hole 2220. A size of the development area may be the same as a size required for the second capacitance hole. Dry etching may be performed on the third mask layer 2223, the second sacrificial layer 2222, and the second support layer at the development areas by means of a bias voltage, to expose the conductive column 4 corresponding, to the second capacitance hole 2220.

Figure 24:
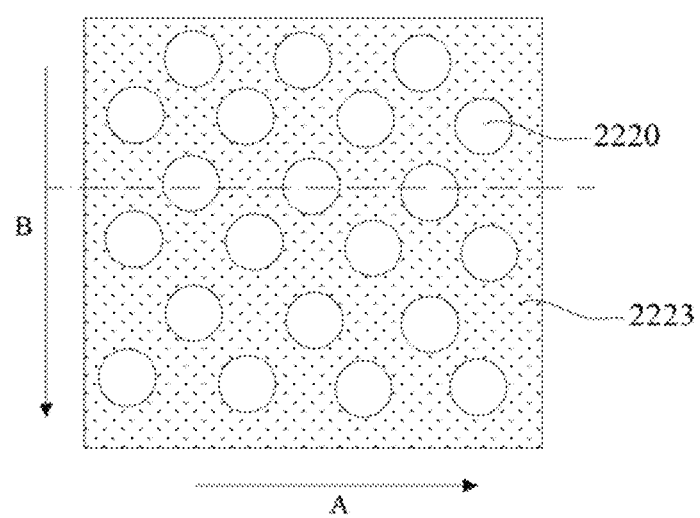
FIG. 24 shows a top view of a structure after S225 is completed according to an embodiment of the disclosure.
Figure 25:
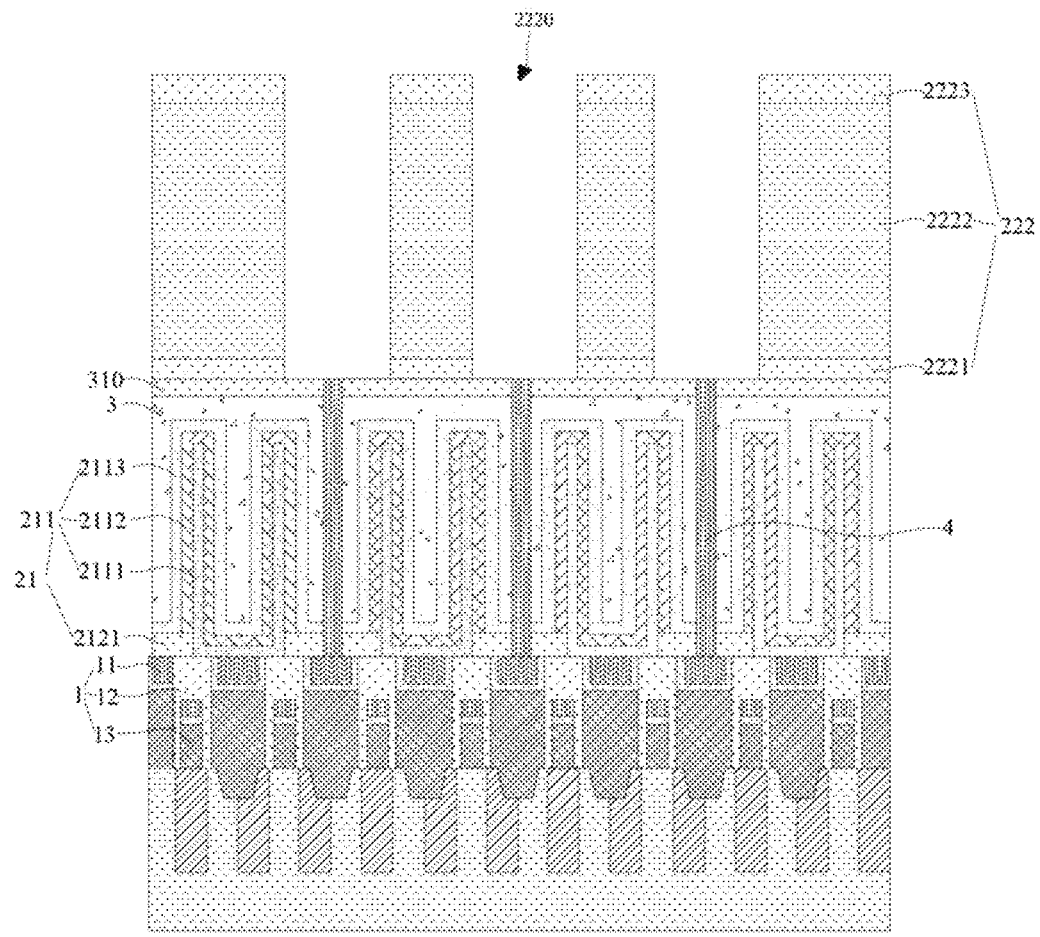
FIG. 25 shows a cross-sectional view of a structure after S225 is completed according to an embodiment of the disclosure.

An etching gas of dry etching may include at least one gas of $SF_6$, $CF_x$, $Cl_2$, or Ar. For example, the etching as may include Ar, or may include at least one gas of $SF_6$, $CF_x$, or $Cl_2$. FIG. 24 is a top view of a structure after S225 is completed according to an embodiment of the disclosure. FIG. 25 is a schematic diagram of a structure after cutting along a dotted line in FIG. 24 according to an embodiment of the disclosure.

At S226, the second capacitance is formed in the second capacitance hole.

The second capacitance 41 may be formed in the second capacitance hole 2220 by means of vacuum evaporation, magnetron sputtering, chemical vapor deposition, physical vapor deposition, or atomic layer deposition. In order to increase the storage capacity of the capacitance, the second capacitance 221 may be designed as a double-sided capacitance.

Figure 26:
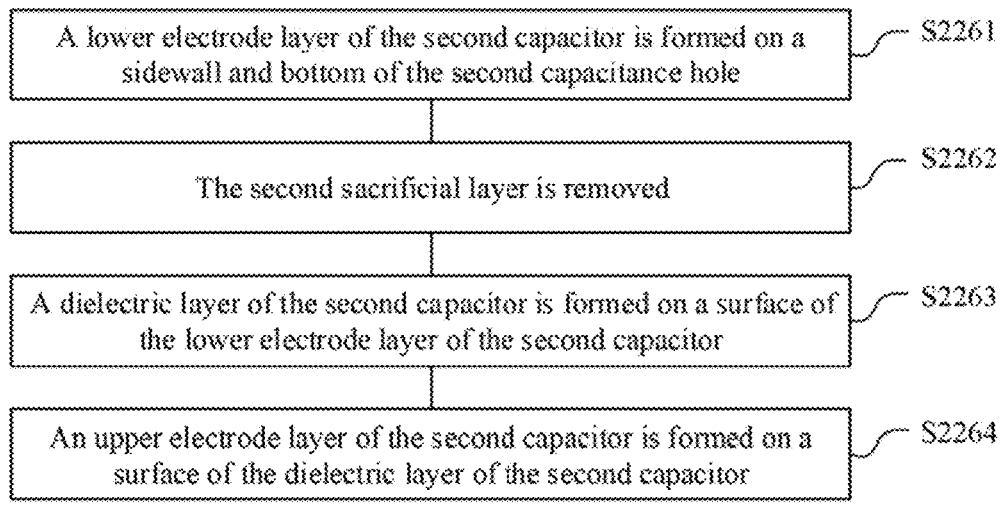
FIG. 26 shows a flowchart of S226 according to an embodiment of the disclosure.

In an exemplary embodiment of the disclosure, the second capacitance 221 is formed in the second capacitance hole 2220. That is to say, S226 may include S2261 to S2264, as shown in FIG. 26.

At S2261, a lower electrode layer of the second capacitance is formed on a sidewall and bottom of the second capacitance hole.

Figure 27:
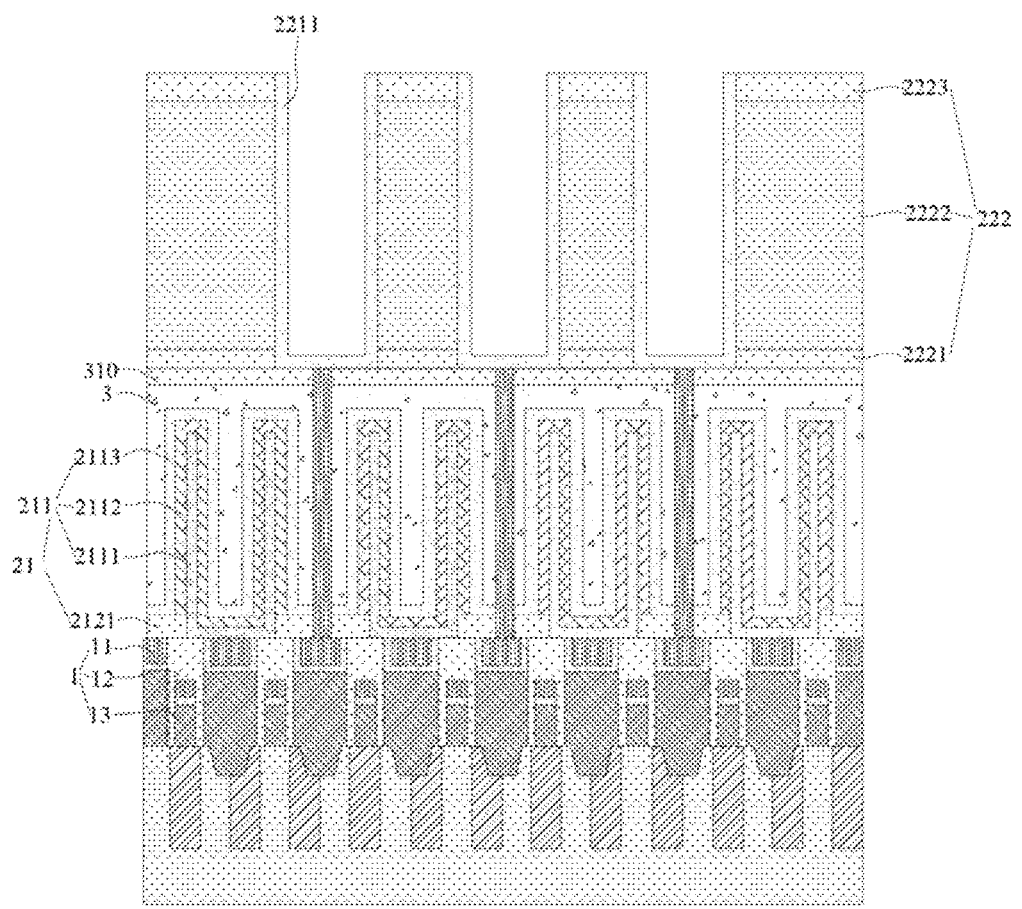
FIG. 27 schematically shows a structure after S2261 is completed according to an embodiment of the disclosure.

A lower electrode layer 2211 of the second capacitance 221 may be formed on a sidewall and bottom of the second capacitance hole 2220. Specifically, the lower electrode layer attached to surfaces of the bottom and sidewall of the second capacitance hole 2220 may be formed in the second capacitance hole 2220. For ease of a process, the lower electrode layer may be simultaneously formed in the second capacitance hole 2220 and the top surface of the first capacitance hole. Subsequently, the lower electrode layer on the top surface of the second capacitance hole 2220 may be removed, and only the lower electrode layer at the bottom and sidewall is retained. A structure of the finally formed lower electrode layer 2211 of the second capacitance 221 is shown in FIG. 27. In addition, the lower electrode layer 2211 of the second capacitance 221 may be in contact connection with the conductive column 4 through the second capacitance hole 2220, to input electric quantities stored in the lower electrode layer 2211 of the second capacitance 221 into the conductive contact plug 11 by using the conductive column 4, so that capacitance storage is realized.

For example, the lower electrode layer 2211 of the second capacitance 221 may be formed in the second capacitance hole 2220 by means of vacuum evaporation, magnetron sputtering, chemical vapor deposition, physical vapor deposition, or atomic layer deposition. Definitely, the lower electrode layer 2211 of the second capacitance 221 may also be formed in other processes. A material of the lower electrode layer 2211 of the second capacitance 221 may be titanium, titanium nitride, or tungsten, or may be other materials that may be used as electrodes, definitely. The material and process for forming the lower electrode layer 2211 of the second capacitance 221 are not particularly limited herein.

It is to be noted that, the third mask layer 2223 may be removed after the lower electrode layer 2211 of the second capacitance 221 is formed, so as to expose the second sacrificial layer 2222. For example, the third mask layer 2223 may be removed by means of dry etching. Definitely, the third mask layer 2223 may also be removed through other manners. The manner of removing the third mask layer 2223 is not particularly limited herein.

At S2262, the second sacrificial layer is removed.

The second sacrificial layer 2222 may be removed after the lower electrode layer 2211 of the second capacitance 221 is formed, and the second support layer is retained. In this way, the storage density of the capacitance may be increased, and the bottom of the lower electrode layer 2211 of the second capacitance 221 may be supported. Therefore, the lower electrode layer 2211 of the second capacitance 221 is prevented from deforming outwards, thereby reducing a short circuit risk.

For example, the second sacrificial layer 2222 may be removed by means of wet etching. For example, wet etching may be performed by using an acid solution. For example, the acid solution may be hydrofluoric acid, or may be Buffered Hydrofluoric Acid (BHF), 49% hydrofluoric acid or Diluted Hydrofluoric Acid (DHF). When the DHF is used as the etching solution, a preparation ratio of the hydrofluoric acid to deionized water may be 1:1 to 1:10. The preparation ratio and concentration of the etching solution are not particularly limited herein.

At S2263, a dielectric layer of the second capacitance is formed on a surface of the lower electrode layer of the second capacitance.

The dielectric layer 2212 of the second capacitance 221 may be formed on the surface of the lower electrode layer 2211 of the second capacitance 221. For example, the dielectric layer 2212 of the second capacitance 221 may be a thin film that is formed on the surface of the lower electrode layer 2211 of the second capacitance 221. The dielectric layer 2212 of the second capacitance 221 may be formed by means of vacuum evaporation, magnetron sputtering, chemical vapor deposition, physical vapor deposition, or atomic layer deposition. Definitely, the dielectric layer 2212 of the second capacitance 221 may also be formed through other manners, which is not listed herein. The dielectric layer 2212 of the second capacitance 221 may be a monolayer film structure formed by a same material, or may be a mixed film layer structure formed by film layers of different materials. For example, the dielectric layer may include materials having dielectric constants. For example, the materials may be alumina, hafnium oxide, lanthanum oxide, titanium oxide, zirconium oxide, tantalum oxide, niobium oxide, strontium oxide, silicon nitride, or mixtures thereof, or may definitely be other materials, which are not listed herein.

At S2264, an upper electrode layer of the second capacitance is formed on a surface of the dielectric layer of the second capacitance.

For example, the upper electrode layer 2213 of the second capacitance 221 may be formed on a surface of the dielectric layer 2212 oldie second capacitance 221 by means of vacuum evaporation, magnetron sputtering, chemical vapor deposition, physical vapor deposition, or atomic layer deposition. Definitely, the upper electrode layer 2213 of the second capacitance 221 may also be formed in other processes, which is not particularly limited herein. A material of the upper electrode layer 2213 of the second capacitance 221 may be titanium nitride, or may definitely be other materials, which is not listed herein. In an embodiment of the formation method of the disclosure, a structure after S2264 is completed is shown in FIG. 16.

In an exemplary embodiment of the disclosure, the method for forming a semiconductor structure further includes the following steps.

At S140, a second semiconductor layer covering the second capacitive layer is formed, and is filled up a gap in the second capacitance and a gap between the second capacitances. The second semiconductor layer is in contact connection with the first semiconductor layer.

After the second capacitive layer 22 is formed, the second semiconductor layer 5 coveting the second capacitive layer 22 may be formed by means of vacuum evaporation, magnetron sputtering, chemical vapor deposition, physical vapor deposition, or atomic layer deposition. The second semiconductor layer 5 may be in complete contact with the upper electrode layer 2213 of each second capacitance 221, so as to facilitate the enhancement of the charging efficiency of the capacitance. Specifically, the second semiconductor layer 5 may cover the surface el the upper electrode layer 2213 of each second capacitance 221, and may be filled in the gap in the second capacitance 221 and the gap between the second capacitances 221. Therefore, the second capacitances 221 may be electrically led out, and the stability of the capacitances in the second capacitive layer 22 may also be improved. The second semiconductor layer 5 may be formed by a silicon material, a metal material or a metal compound. For example, the silicon material, the metal material and the metal compound may be silicon, silicon germanium, tungsten, titanium silicide, titanium oxide, or tungsten oxide, which are not particularly limited herein.

Figure 28:
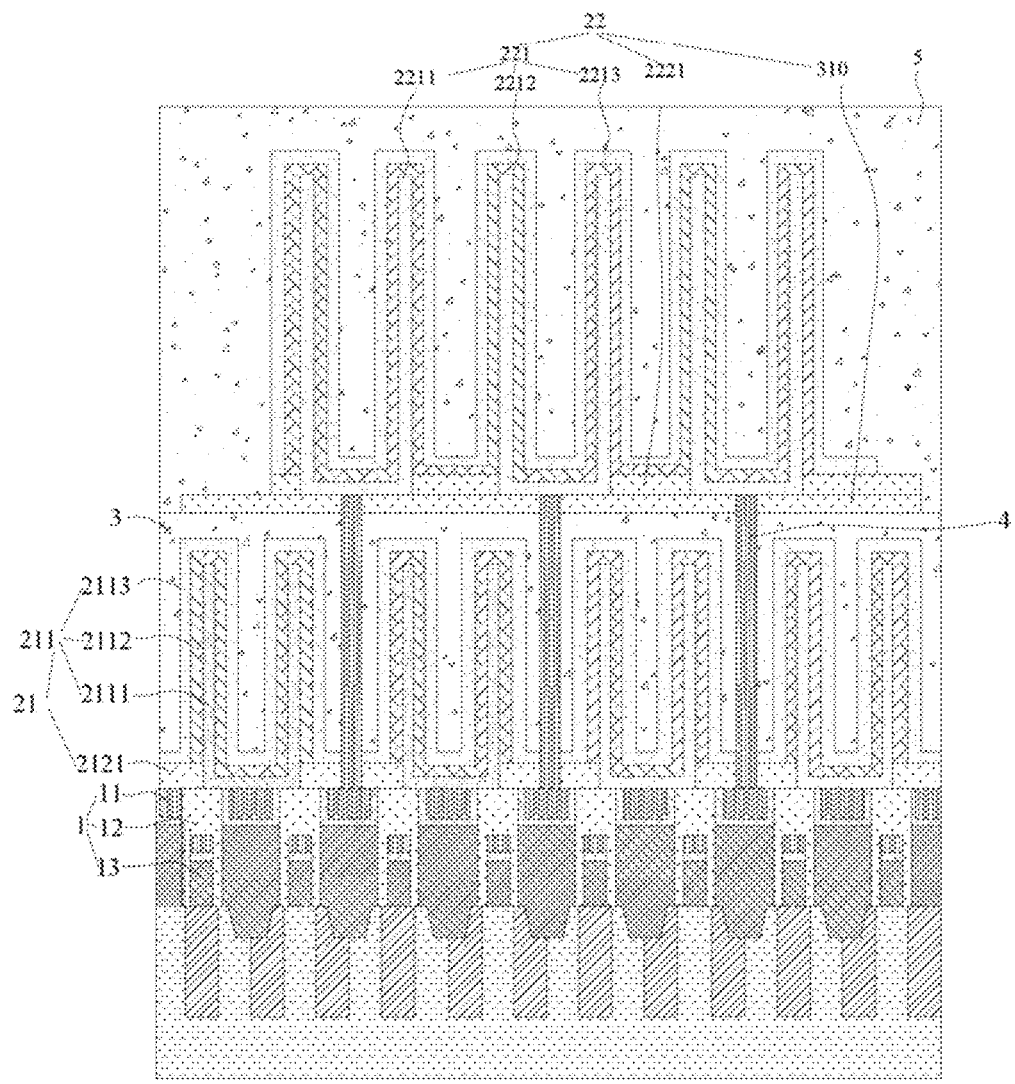
FIG. 28 schematically shows a structure after S140 is completed according to an embodiment of the disclosure.

In an embodiment, orthographic projections of the second support layer and each second capacitance 221 on the substrate 1 may be in an orthographic projection of the second semiconductor layer 5 on the substrate 1, so as to completely coat each second capacitance 221 by using the second semiconductor layer 5, thereby avoiding electric leakage. In addition, the second semiconductor layer 5 may also be in contact connection with the first semiconductor layer 3, so that the charge collected by the first capacitive layer 21 and the second capacitive layer 22 may be converged together by using the first semiconductor layer 3 and the second semiconductor layer 5, which is led out together. In an embodiment of the disclosure, a structure idler S140 is completed is shown in FIG. 28.

It is to be noted that, although the various steps of the method for forming a semiconductor structure in the disclosure are described in a particular order in the drawings, this does not require or imply that the steps must be performed in the particular order, or that all shown steps must be performed to achieve desired results. Additionally or alternatively, certain steps may be omitted, a plurality of steps may be combined into one step for execution, and/or one step may be decomposed into a plurality steps for execution, and the like.

An embodiment of the disclosure further provides a semiconductor structure. As shown in FIG. 16, the semiconductor structure may include a substrate 1 and a plurality of capacitive layers.

The substrate 1 includes a plurality of conductive contact plugs 11 in array distribution and insulation layers 12 separating the conductive contact plugs 11.

The capacitive layers are formed on a surface of the substrate 1, and stacked and distributed in a direction perpendicular to the substrate 1. Each of the capacitive layers includes a plurality of capacitances distributed at intervals. The capacitances are respectively connected to different conductive contact plugs 11.

According to the semiconductor structure, in an aspect, the number of capacitances is increased by designing the plurality of capacitive layers. During using, the capacitances in the plurality of capacitive layers may be simultaneously charged and discharged, so that the storage capacity of capacitances can be increased. In another aspect, during capacitance layout, since the layout space of each layer is relatively large, the radial sizes of the capacitances in each layer may be appropriately increased, so that the superficial area of each capacitance is increased. Therefore, the storage capacity of capacitances can be further increased. During manufacturing, the height of each capacitive layer may be appropriately reduced, so that the difficulty of forming the capacitance holes through etching can be reduced, and the difficulty of coating the capacitance holes to form the capacitances is also reduced. In this way, it is guaranteed that each capacitance hole can be completely etched, so that each capacitance formed in the capacitance hole can be connected to a conductive structure at the bottom of the capacitance hole. Therefore, the charge collected by each capacitance can be guaranteed to be stored, and the failure or collapse of some capacitances due to hanging may also be prevented, thereby increasing product yield.

Details of the semiconductor structure according to the embodiments of the disclosure are described in detail below.

As shown in FIG. 2 and FIG. 3, the substrate 1 may be in a flat plate structure and includes a bit line structure 13. A formation area of the bit line structure 13 and a formation area of a capacitance contact hole 101 may be predefined on the substrate 1. The formation area of the bit line structure 13 may be configured to form the bit line structure 13. The formation area of the capacitance contact hole 101 may be configured to form the conductive contact plug 11.

As shown in FIG. 4 and FIG. 5, the substrate 1 may include an insulation layer 12. The insulation layer 12 may cover a top and sidewall of the hit line structure 13. For example, after the bit line structure 13 is formed in the formation area of the hit line structure 13, a material for insulation layer 12 is deposited on a surface of the bit line structure 13, so that the insulation layer 12 is formed. Then the insulation material is etched at portions corresponding to the formation areas of the capacitance contact holes 101, so as to form a plurality of capacitance contact holes 101 distributed at intervals in the insulation layer 12, and the conductive contact plugs 11 are formed in the capacitance contact holes 101. The conductive contact plugs 11 may be separated by using the insulation layer 12, to avoid the coupling or short circuit between the conductive contact plugs 11.

The conductive contact plugs 11 may be formed by conductors or semiconductor materials. For example, the materials may be tungsten, copper, polysilicon, or the like. The conductive contact plugs 11 may be formed in the capacitance contact holes 101 by means of vacuum evaporation, magnetron sputtering, chemical vapor deposition, physical vapor deposition, or atomic layer deposition. Definitely, the conductive contact plugs 11 may also be formed in other manners, which are not listed herein.

As shown in FIG. 4, in the disclosure, a plurality of sets of conductive contact plugs 11 distributed at intervals in a first direction A may be included. For example, the conductive contact plugs 11 in each set may be equidistantly distributed at intervals in the first direction A. The plurality of sets of conductive contact plugs 11 may be distributed at intervals in a second direction B. For example, each set of conductive contact plugs 11 may be equidistantly distributed at intervals in the second direction B. The first direction A may be perpendicular to the second direction B. That is to say, the conductive contact plugs 11 may be distributed in arrays in the form of rows and columns.

The capacitive layer may include a plurality of capacitances. The capacitances may be arranged at intervals and distributed in arrays. For example, the number of the capacitances in each capacitive layer may be two, four, six, eight, or ten. Definitely, there may be more capacitances, which are not listed herein. There may be a plurality of capacitive layers. The plurality of capacitive layers may be stacked and distributed in a direction perpendicular to the substrate 1. For example, the number of the capacitive layers may be two, three, four, or five. Definitely, other number of the capacitive layers may also be available, which is not listed herein.

In an exemplary embodiment of the disclosure, the capacitances in the two adjacent capacitive layers may be staggered, and each capacitance may be directly or indirectly connected to different conductive contact plugs 11, so that the charge collected in the capacitances is stored by using the conductive contact plugs 11. During using, the capacitances in the plurality of capacitive layers may be simultaneously charged and discharged, so that the storage capacity of capacitances can be increased. During capacitance layout, the layout space of each capacitive layer is relatively large, and the radial sizes of the capacitances in each capacitive layer may be appropriately increased, so that the superficial area of each capacitance is increased. Therefore, the storage capacity of the capacitances can be timber increased.

In an exemplary embodiment of the disclosure, the number of the capacitive layers may be two, which may be a first capacitive layer 21 and a second capacitive layer 22, respectively.

As shown in FIG. 7, the first capacitive layer 21 may include the plurality of first capacitances 211 distributed at intervals. The cross section of each first capacitance 211 may be circular, triangular or square, which is not particularly limited herein.

In an embodiment of the disclosure, the superficial area of each first capacitance 211 may be appropriately increased. By using the first capacitance 211 with the cross section of circular as an example, the circumference of each first capacitance 211 may be lengthened by 20% to 60% of the circumference of an original capacitance. Since the capacity of the capacitance is proportional to the superficial area of the capacitance, an etching height of the first capacitance 211 may be reduced by 20% to 60% without changing the capacity of the first capacitance 211, so that the difficulty of forming the capacitance hole may be reduced, and the difficulty of coating the first capacitance hole to form the first capacitance 211 may also be reduced. In this way, it is guaranteed that each first capacitance hole can be etched, so that each first capacitance 211 formed in the first capacitance hole can be connected to the conductive contact plug 11. Therefore, charge collected by each first capacitance 211 can be guaranteed to be stored, and the failure or collapse of some first capacitances 211 due to hanging may also be prevented, thereby increasing product yield.

The conductive contact plug 11 may correspondingly fie distributed under each first capacitance 211. An orthographic projection of each first capacitance 211 on the substrate 1 may at least partially overlap with the conductive contact plug 11 under the first capacitance. In the embodiment of the disclosure, the first capacitance 211 may be in contact connection with the conductive contact plug 11 under the first capacitance.

In an exemplary embodiment of the disclosure, the first capacitance 211 may include a lower electrode layer, a dielectric layer, and an upper electrode layer.

The lower electrode layer 2111 of the first capacitance 211 may be in contact connection with the conductive contact plug 11 under the lower electrode layer, and may extend to a side away from the substrate 1 in a direction perpendicular to the substrate 1. In this way, electric quantities stored in the first capacitance 211 are inputted into the conductive contact plug 11 by using the lower electrode layer 2111 of the first capacitance 211, realizing capacitance storage.

A material of the lower electrode layer 2111 of the first capacitance 211 may be a conductive material, such as titanium, titanium nitride, or tungsten, or may be other materials that may be used as electrodes, definitely. The material of the lower electrode layer 2111 of the first capacitance 211 is not particularly limited herein.

In an exemplary embodiment of the disclosure, the first capacitive layer 21 may further include a first support layer 2121. The first support layer 2121 may be located on the surface of the substrate 1, and may be coated on the periphery of the lower electrode layer 2111 of each first capacitance 211, so that the bottom of the lower electrode layer 2111 of the first capacitance 211 may be supported by using the first support layer 2121. Therefore, the lower electrode layer 2111 of each first capacitance 211 is prevented from deforming outwards, thereby reducing a short circuit risk.

The first support layer 2121 may be a thin film formed on the surface of the substrate 1, of which material may be $Si_3N_4$ or SiCN and thickness may range from 20 nm to 200 nm.

The dielectric layer 2112 of the first capacitance 211 may be formed on a surface of the lower electrode layer 2111 of each first capacitance 211. For example, the dielectric layer 2112 of the first capacitance 211 may be a thin film that is formed on the surface of the lower electrode layer 2111 of the first capacitance 211, or may be a coating formed on the surface of the lower electrode layer 2111 of the first capacitance 211. A specific form of the dielectric layer 2112 of the first capacitance 211 is not particularly limited herein.

The dielectric layer 2112 of the first capacitance 211 may be a monolayer film structure formed by a same material, or may be a mixed film layer structure formed by film layers of different materials. For example, the dielectric layer may include materials having dielectric constants, such as alumina, hafnium oxide, lanthanum oxide, titanium oxide, zirconium oxide, tantalum oxide, niobium oxide, strontium oxide, silicon nitride, or mixtures thereof, of may definitely be other materials, which are not listed herein.

The upper electrode layer 2113 of the first capacitance 211 may be formed on a surface of the dielectric layer 2112 of the first capacitance 2113 material of the upper electrode layer 2113 of the first capacitance 211 may be a conductive material, such as titanium, titanium nitride, or tungsten, or may be other materials that may be used as electrodes, definitely. The material of the upper electrode layer 2113 of the first capacitance 211 is not particularly limited herein.

As shown in FIG. 16, the second capacitive layer 22 may be disposed on the side of the first capacitive layer 21 facing away from the substrate L The second capacitive layer 22 may include the plurality of second capacitances 221 distributed at intervals. The cross section of each second capacitance 221 may be circular or square, which is not particularly limited herein.

In an embodiment of the disclosure, the superficial area of each second capacitance 221 may be appropriately increased. By using the second capacitance 221 with the cross section of circular as an example, the circumference of each second capacitance 221 may be lengthened by 20% to 60% of the circumference of an original capacitance. Since the capacity of the capacitance is proportional to the superficial area of the capacitance, an etching height of the second capacitance 221 may be reduced by 20% to 60% without changing the capacity of the second capacitance 221, so that the difficulty of forming the second capacitance hole may be reduced, and the difficulty of coating the second capacitance hole to form the second capacitance 221 may also be reduced. In this way, it is guaranteed that each second capacitance hole can be etched, so that each second capacitance 221 formed in the second capacitance hole can be connected to the conductive contact plug 11. Therefore, charge collected by each second capacitance 221 can be guaranteed to be stored, and the failure or collapse of some second capacitances 221 due to hanging may also be prevented, thereby increasing product yield.

The conductive contact plug 11 may correspondingly be distributed under each second capacitance 221. An orthographic projection of each second capacitance 221 on the substrate 1 may at least partially overlap with the conductive contact plug 11 under the second capacitance, in this embodiment of the disclosure, the second capacitance 221 may be indirectly connected to the conductive contact plug 11 under the second capacitance by using other conductive structures.

In an exemplary embodiment of the disclosure, as shown in FIG. 18, the semiconductor structure may further include a first semiconductor layer 3. The first semiconductor layer 3 may cover the first capacitive layer 21. The first semiconductor layer 3 may be in complete contact with the upper electrode layer 2113 of each first capacitance 211, so as to facilitate the enhancement of the charging efficiency of the capacitance. Specifically, the first semiconductor layer 3 may cover the surface of the upper electrode layer 2113 of each first capacitance 211, and may be filled up the gap in the first capacitance 211 and the gap between the first capacitances 211. Therefore, the first capacitances 211 may be electrically led out, and the stability of the capacitances in the first capacitive layer 21 may also be improved.

The first semiconductor layer 3 may be formed by a silicon material, a metal material or a metal compound, such as silicon, silicon germanium, tungsten, titanium silicide, titanium oxide, or tungsten oxide, which are not particularly limited herein.

In an embodiment, orthographic projections of the first support layer 2121 and each first capacitance 211 on the substrate 1 may be in an orthographic projection of the first semiconductor layer 3 on the substrate 1, so as to completely coat each first capacitance 211 by using the first semiconductor layer 3, thereby avoiding electric leakage.

In an exemplary embodiment of the disclosure, the via 301 penetrating the first semiconductor layer 3 and the first support layer 2121 may be formed by means of etching. There may be a plurality of vias 301. At least one conductive contact plug 11 may be exposed from the bottom of each via 301. Preferably, one conductive contact plug 11 may be exposed from each via 301. The conductive contact plug 11 may be the conductive contact plug 11 other than the conductive contact plug 11 connected to the first capacitance 211.

The insulation material layer is formed on a sidewall of the via 301. A structure in the via 301 and the first semiconductor layer 3 may be isolated by using the insulation material layer, so that a short circuit due to electric leakage between the structure in the via 301 and the first semiconductor layer 3 is prevented. A material of the insulation material layer may be a material with a low dielectric constant, for example, may be SiCo, carbon-doped oxide, or silicon nitride. The thickness of the insulation material layer may range from 1 to 3 nm. The material and thickness of the insulation material layer are not limited herein.

The via 301 may be filled with the conductive material. The conductive material may be filled up the via 301, so as to form the conductive column 4 in the via 301. The conductive column 4 may be in contact connection with the conductive contact plug 11 at the bottom of the via 301. Therefore, the conductive contact plug 11 may be electrically led out by using the conductive column 4. The conductive material may be the same as the material of the conductive contact plug 11. For example, the conductive material may be tungsten.

In an exemplary embodiment of the disclosure, the second capacitive layer 22 may be formed on a side of the first semiconductor layer 3 facing away from the substrate 1. The second capacitance 221 may include a lower electrode layer, a dielectric layer, and an upper electrode layer.

The lower electrode layer 2211 of the second capacitance 221 may be in contact connection with the conductive column 4 under the lower electrode layer in a one-to-one correspondence, and may extend to a side away from the substrate 1 in a direction perpendicular to the substrate 1. In this way, electric quantities stored in the second capacitance 221 are inputted into the conductive contact plug 11 by using the lower electrode layer 2211 of the second capacitance 221 by using the conductive column 4, realizing capacitance storage.

A material of the lower electrode layer 2211 of the second capacitance 221 may be a conductive material, such as titanium, titanium nitride, or tungsten, or may be other materials that may be used as electrodes, definitely. The material of the lower electrode layer 2211 of the second capacitance 221 is not particularly limited herein.

In an exemplary embodiment of the disclosure, the second capacitive layer 22 may further include a second support layer. The second support layer may be located on the surface of the first semiconductor layer 3, and may be coated on the periphery of the lower electrode layer 2211 of each second capacitance 221, so that the bottom of the lower electrode layer 2211 of the second capacitance 221 may be supported. Therefore, the lower electrode layer 2211 of the second capacitance 221 is prevented from deforming outwards, thereby reducing a short circuit risk.

The second support layer may be a thin film formed on the surface of the first semiconductor layer 3, of which material may be $Si_3N_4$ or SiCN and thickness may range from 20 nm to 200 nm.

The dielectric layer 2212 of the second capacitance 221 may be formed on a surface of the lower electrode layer 2211 of each second capacitance 221. For example, die dielectric layer 2212 of the second capacitance 221 may be a thin film that is formed on the surface of the lower electrode layer 2211 of the second capacitance 221, or may, be a coating formed on the surface of the lower electrode layer 2211 of the second capacitance 221. A specific form of the dielectric layer 2212 of the second capacitance 221 is not particularly limited herein.

The dielectric layer 2212 of the second capacitance 221 may be a monolayer film structure formed by a same material, or may be a mixed film layer structure formed by film layers of different materials. For example, the dielectric layer may include materials having high dielectric constants, such as alumina, hafnium oxide, lanthanum oxide, titanium oxide, zirconium oxide, tantalum oxide, niobium oxide, strontium oxide, silicon nitride, or mixtures thereof, or may definitely be other materials, which are not listed herein.

The upper electrode layer 2213 of the second capacitance 221 may be formed on a surface of the dielectric layer 2212 of the second capacitance 221. A material of the upper electrode layer 2213 of the second capacitance 221 may be a conductive material, such as may be titanium, titanium nitride, or tungsten, or may be other materials that may be used as electrodes, definitely. The material of the upper electrode layer 2213 of the second capacitance 211 is not particularly limited herein.

In an exemplary embodiment of the disclosure, as shown in FIG. 28, the semiconductor structure may further include a second semiconductor layer 5. The second semiconductor layer 5 may cover the second capacitive layer 22. The second semiconductor layer 5 may be in complete contact with the upper electrode layer 2213 of each second capacitance 221, so as to facilitate the enhancement of the charging efficiency of the capacitance. Specifically, the second semiconductor layer 5 may cover the surface of the upper electrode layer 2213 of each second capacitance 221, and may be filled up the gap in the second capacitance 221 and the gap between the second capacitances 221. Therefore, the second capacitances 221 may be electrically led out, and the stability of the capacitances in the second capacitive layer 22 may also be improved.

The second semiconductor layer 5 may be formed by a silicon material, a metal material or a metal compound, such as silicon, silicon germanium, tungsten, titanium silicide, titanium oxide, or tungsten oxide, which is not particularly limited herein.

In an embodiment, orthographic projections of the second support layer and each second capacitance 221 on the substrate 1 may be in an orthographic protection of the second semiconductor layer 5 on the substrate 1, so as to completely coat each second capacitance 221 by using the second semiconductor layer 5, thereby avoiding electric leakage. In addition, the second semiconductor layer 5 may also be in contact connection with the first semiconductor layer 3, so that the charge collected by the first capacitive layer 21 and the second capacitive layer 22 may be converged and led out together by using the first semiconductor layer 3 and the second semiconductor layer 5.

An embodiment of the disclosure further provides a memory. The memory may include the semiconductor structure in any of the above embodiments. The specific details, formation process and beneficial effects of the memory have been described in detail in the method for forming a semiconductor structure and the semiconductor structure, which are not be described herein again.

For example, the memory may be a Dynamic Random Access Memory (DRAM), a Static Random Access Memory (SRAM), or the like. Definitely, the memory may also be other storage apparatuses, which is not listed herein.

Other embodiments of the disclosure will readily occur to those skilled in the art upon consideration of the specification and practice of the invention disclosed herein. The disclosure is intended to cover any variations, uses, or adaptations of the disclosure that follow the general principles of the disclosure and include common knowledge or techniques in the technical field that are not disclosed by the disclosure. The specification and examples are to be regarded as exemplary only, with the true scope and spirit of the disclosure being indicated by the appended claims.

The invention claimed is:

1. A method for forming a semiconductor structure, comprising:
   providing a substrate, the substrate comprising a plurality of conductive contact plugs in array distribution and insulation layers separating the conductive contact plugs;
   forming a plurality of capacitive layers stacked and distributed in a direction perpendicular to the substrate on a surface of the substrate, each of the capacitive layers comprising a plurality of capacitances distributed at intervals, and the capacitances being respectively connected to different conductive contact plugs;
   wherein
   the forming a plurality of capacitive layers stacked and distributed in a direction perpendicular to the substrate on a surface of the substrate, each of the capacitive layer comprising a plurality of capacitances distributed at intervals, and the capacitances being respectively connected to different conductive contact plugs comprises:
forming a first capacitive layer on the surface of the substrate, the first capacitive layer comprising, a plurality of first capacitances, and the first capacitances being respectively connected to different conductive contact plugs; and
forming a second capacitive layer on a side of the first capacitive layer facing away from the substrate, the second capacitive layer comprising a plurality of second capacitances, the second capacitances being respectively connected to different, conductive contact plugs, and the conductive contact plugs connected to the second capacitances and the conductive contact plugs connected to the first capacitances being different conductive contact plugs; and
forming a first semiconductor layer covering the first capacitive layer, the first semiconductor layer being filled up a gap in the first capacitance and a gap between the first capacitances.

2. The method of claim 1; wherein
the forming a first capacitive layer on the surface of the substrate, the first capacitive layer comprising a plurality of first capacitances, and the first capacitances being respectively connected to different conductive contact plugs comprises:
forming a first stacked film layer on the surface of the substrate;
forming a plurality of first capacitance holes distributed at intervals in the first stacked film layer, at least one conductive contact plug being, exposed from each first capacitance hole; and
forming the first capacitance in the first capacitance hole.

3. The method of claim 2, wherein
the first stacked film layer comprises a first support layer and a first sacrificial layer; the first sacrificial layer is formed on a side of the first support layer facing away from the substrate; and the forming the first capacitance in the first capacitance hole comprises:
forming a lower electrode layer of the first capacitance on a sidewall and bottom of the first capacitance hole;
removing the first sacrificial layer;
forming a dielectric layer of the first capacitance on a surface of the lower electro layer of the first capacitance; and
forming an upper electrode layer of the first capacitance on a surface of the dielectric layer of the first capacitance.

4. The formation method of claim 1, wherein
the forming a second capacitive layer on a side of the first capacitive layer facing away from the substrate, the second capacitive layer comprising a plurality of second capacitances, the second capacitances being respectively connected to different conductive contact plugs, and the conductive contact plugs connected to the second capacitances and the conductive contact plugs connected to the first capacitances being different conductive contact plugs comprises:
forming a via penetrating the first semiconductor layer and the first support layer, an orthographic projection of the via on the substrate not overlapping with an orthographic projection of the first capacitance hole, and at least one conductive contact plug being exposed from each via; and
forming an insulation material layer on a sidewall of be via;
filling the via with a conductive material to form a conductive column, the insulation:
material layer being in contact connection with a sidewall of the conductive column;
forming second stacked film layers on sides of the first semiconductor layer and the conductive column facing away from the substrate;
forming a plurality of second capacitance holes distributed at intervals in the second stacked film layers, at least one conductive column being exposed from each second capacitance hole; and
forming the second capacitance in the second capacitance hole.

5. The method of claim 4, wherein
the second stacked film layer comprises a second support layer and a second sacrificial layer; the second sacrificial layer is formed on a side of the second support layer facing away from the substrate; and the forming the second capacitance in the second capacitance hole comprises:
forming a lower electrode layer of the second capacitance on a sidewall and bottom of the second capacitance hole;
removing the second sacrificial layer;
forming a dielectric layer of the second capacitance on a surface of the lower electrode layer of the second capacitance; and
forming an upper electrode layer of the second capacitance on a surface of the dielectric layer of the second capacitance.

6. The formation method of claim 1, further comprising:
forming a second semiconductor layer covering the second capacitive layer, the second semiconductor layer being filled up a gap in the second capacitance and a gap between the second capacitances, and the second semiconductor layer being in contact connection with the first semiconductor layer.

7. A semiconductor structure, comprising:
a substrate, comprising a plurality of conductive contact plugs in array distribution and insulation layers separating the conductive contact plugs;
a plurality of capacitive layers, each of the capacitive layers being formed on a surface of the substrate and stacked and distributed in a direction perpendicular to the substrate, and comprising a plurality of capacitances distributed at intervals, wherein the capacitances are respectively connected to different conductive contact plugs;
wherein
the plurality of capacitive layers comprise:
a first capacitive layer, located on the surface of the substrate and comprising a plurality of first capacitances, wherein the first capacitances are respectively connected to different conductive contact plugs; and
a second capacitive layer, located on a side of the first capacitive layer facing away from the substrate and comprising a plurality of second capacitances, wherein the second capacitances are respectively connected to different conductive contact plugs, and the conductive contact plugs connected to the second capacitances and the conductive contact plugs connected to the first capacitances are different conductive contact plugs; and
a first semiconductor layer, covering the first capacitive layer, wherein the first semiconductor layer is filled up a gap in the first capacitance and a gap between the first capacitances.

8. The semiconductor structure of claim 7, wherein the first capacitive layer comprises:
a plurality of first capacitances, distributed at intervals, wherein each of the first capacitances is in contact connection with the conductive contact plug.

9. The semiconductor structure of claim 8, wherein
the first capacitive layer comprises a first support layer; the first capacitance comprises a lower electrode layer, a dielectric layer, and an upper electrode layer; the first support layer is coated at a periphery of a side of the lower electrode layer close to the substrate; and the dielectric layer is formed on a surface of the lower electrode layer, and the upper electrode layer is formed on a surface of the dielectric layer.

10. The semiconductor structure of claim 7, wherein
a via penetrates and is harmed in the first semiconductor layer and the first support layer, an orthographic projection of the via on the substrate is not overlapping with an orthographic projection of the first capacitance hole, and at least one conductive contact plug is exposed from each via;
the semiconductor structure further comprises:
an insulation material layer, formed on a sidewall of the via; and
a conductive column, located in the via, wherein the insulation material layer is in contact connection with a sidewall of the conductive column; and
the second capacitive layer comprises:
a plurality of second capacitances, located on sides of the first semiconductor layer and the conductive column facing away from the substrate, wherein the second capacitances are distributed at intervals, and are in one-to-one correspondence with and connected to the conductive columns.

11. The semiconductor structure of claim 10, wherein
the second capacitive layer comprises a second support layer; the second capacitance comprises a lower electrode layer, a dielectric layer, and an upper electrode layer; the second support layer is coated at a periphery of a side of the lower electrode layer close to the substrate; and the dielectric layer of the second capacitance is formed an a surface of the lower electrode layer of the second capacitance, and the upper electrode layer of the second capacitance is formed on a surface of the dielectric layer of the second capacitance.

12. The semiconductor structure of claim 7, further comprising:
a second semiconductor layer, covering the second capacitive layer, wherein the second semiconductor layer is filled up a gap in the second capacitance and a gap between the second capacitances, and the second semiconductor layer is in contact connection with the first semiconductor layer.

13. A memory, comprising the semiconductor structure of claim 7.

* * * * *